(12) United States Patent
Moon et al.

(10) Patent No.: US 12,075,661 B2
(45) Date of Patent: Aug. 27, 2024

(54) DISPLAY APPARATUS

(71) Applicant: LG Display Co., Ltd., Seoul (KR)

(72) Inventors: Kyeong-Ju Moon, Paju-si (KR);
So-Young Noh, Goyang-si (KR);
Ki-Tae Kim, Seoul (KR); Hyuk Ji,
Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/156,228

(22) Filed: Jan. 18, 2023

(65) Prior Publication Data

US 2023/0157089 A1     May 18, 2023

Related U.S. Application Data

(63) Continuation of application No. 17/126,547, filed on Dec. 18, 2020, now Pat. No. 11,587,997.

(30) Foreign Application Priority Data

Dec. 31, 2019   (KR) .......................... 10-2019-0180051

(51) Int. Cl.
*H01L 29/786* (2006.01)
*H10K 59/124* (2023.01)

(52) U.S. Cl.
CPC ....... *H10K 59/124* (2023.02); *H01L 29/7869* (2013.01)

(58) Field of Classification Search
CPC ............ H10K 59/124; H10K 59/1213; H10K 59/121; H10K 50/80; H10K 50/805; H10K 50/88; H01L 27/1222; H01L 27/12; H01L 27/1248; H01L 27/1225; H01L 27/1251;
(Continued)

(56) References Cited

U.S. PATENT DOCUMENTS 10,923,036 B2    2/2021   Lee
2018/0151125 A1  5/2018   Lee

FOREIGN PATENT DOCUMENTS

KR   10-2018-0079082 A   7/2018

OTHER PUBLICATIONS

United States Office Action, U.S. Appl. No. 17/126,547, filed Jun. 3, 2022, 14 pages.

*Primary Examiner* — Nikolay K Yushin
(74) *Attorney, Agent, or Firm* — Fenwick & West LLP

(57) ABSTRACT

A display apparatus includes a first TFT in a display area including a first semiconductor pattern including a polysilicon, a first gate electrode overlapping with the first semiconductor pattern under conditions that a first gate insulating layer is interposed, and first source and drain electrodes connected to the first semiconductor pattern, a second TFT in the display area including a second semiconductor pattern including a first oxide semiconductor, a second gate electrode overlapping with the second semiconductor pattern under conditions that second and third gate insulating layers are interposed, second source and drain electrodes connected to the second semiconductor pattern, and a third TFT in a non-display area including a third semiconductor pattern including a second oxide semiconductor, a third gate electrode overlapping with the third semiconductor pattern under conditions that the third gate insulating layer is interposed, and third source and drain electrodes connected to the third semiconductor pattern.

19 Claims, 4 Drawing Sheets

(58) Field of Classification Search
CPC .............. H01L 29/7869; H01L 29/786; H01L 29/78696
See application file for complete search history.

DISPLAY APPARATUS

CROSS-REFERENCE TO RELATED APPLICATIONS

This application is a continuation of U.S. patent application Ser. No. 17/126,547 filed on Dec. 18, 2020, which claims the benefit of Republic of Korea Patent Application No. 10-2019-0180051 filed on Dec. 31, 2019, each of which is hereby incorporated by reference in its entirety.

BACKGROUND

Field of Technology

The present disclosure relates to a display apparatus including thin film transistors.

Discussion of the Related Art

Generally, an electric appliance such as a monitor, a television (TV), a notebook computer, or a digital camera includes a display apparatus configured to realize an image. For example, display apparatuses may include a liquid crystal display (LCD) apparatus including liquid crystals and an electroluminescent display (ELD) apparatus including a light emitting layer.

Among such display apparatuses, the ELD apparatus uses a self-luminous device configured to emit light by itself.

A display apparatus may include a plurality of pixels. Each pixel may emit a particular color. A driving device may be disposed in each pixel in order to generate drive current according to a gate signal and a data signal. For example, the driving device may include at least one thin film transistor.

Thin film transistors may be, based on a material constituting an active layer, classified into an amorphous thin film transistor in which amorphous silicon is used for an active layer, a polycrystalline silicon thin film transistor in which polycrystalline silicon is used for an active layer, and an oxide semiconductor thin film transistor in which an oxide semiconductor is used for an active layer.

The amorphous silicon thin film transistor (a-Si TFT) has advantages of short manufacturing process time and low production costs because the active layer thereof may be formed through deposition of amorphous silicon within a short period of time. On the other hand, the amorphous silicon thin film transistor exhibits inferior current drivability and a variation in threshold voltage due to low mobility and, as such, has a drawback in that use thereof in an active matrix organic light emitting diode (AMOLED) is restricted.

The polycrystalline silicon thin film transistor (poly_Si TFT) is manufactured through deposition of amorphous silicon and crystallization of the deposited amorphous silicon. The polycrystalline silicon thin film transistor has advantages in that the polycrystalline silicon thin film transistor has high electron mobility, excellent stability while achieving thinness, high resolution and high electric power efficiency. As such a polycrystalline silicon thin film transistor, there is a low temperature polycrystalline silicon (LTPS) thin film transistor or a polysilicon thin film transistor. In such a polycrystalline silicon thin film transistor, however, crystallization of amorphous silicon is required in a manufacturing process of the polycrystalline silicon thin film transistor. For this reason, an increase in the number of processes and an increase in manufacturing costs occur. Furthermore, crystallization should be carried out at a high process temperature. As a result, application of the polycrystalline silicon thin film transistor to a large-area apparatus is difficult. In addition, it is difficult to secure uniformity of the polycrystalline silicon thin film transistor due to characteristics of polycrystallinity.

The oxide semiconductor thin film transistor has high mobility while exhibiting high resistance variation in accordance with an oxygen content thereof and, as such, has an advantage in that it may be possible to easily obtain desired physical properties. In addition, an oxide constituting an active layer may be formed at a relatively low temperature in a process of manufacturing the oxide semiconductor thin film transistor and, as such, manufacturing costs are low. Since the oxide semiconductor is transparent in accordance with characteristics of oxide, the oxide semiconductor thin film transistor is also advantageous in realizing a transparent display. However, the oxide semiconductor thin film transistor has a drawback in that stability and electron mobility are degraded, as compared to the polycrystalline silicon thin film transistor.

The oxide semiconductor thin film transistor may be manufactured to have a back channel etch (ECE) structure or an etch stopper (ES) structure which is of a bottom gate type. Otherwise, the oxide semiconductor thin film transistor may be manufactured to have a coplanar structure which is of a top gate type. In the case of an oxide semiconductor thin film transistor having a coplanar structure, it is very important to control a conductive region formed by an oxide semiconductor. In accordance with sheet resistance of the conductive region, mobility of the oxide semiconductor thin film transistor may vary. Therefore, it is necessary to manage process conditions for formation of the conductive region. It is also necessary to reduce influence of insulating layers disposed over or beneath the oxide semiconductor layer on the conductive region.

SUMMARY

Accordingly, the present disclosure is directed to a display apparatus that substantially obviates one or more problems due to limitations and disadvantages of the related art.

An object of the present disclosure is to provide a display device including a thin film transistor including a conductor formed through doping without patterning of a gate insulating film.

Another object of the present disclosure is to provide a display device in which a thin film transistor disposed in a non-display area while including an oxide semiconductor has mobility different from that of a thin film transistor disposed in a display area while including an oxide semiconductor.

Another object of the present disclosure is to provide a display device in which a driving thin film transistor configured to control current flowing a light emitting device disposed in a display area has mobility different from that of a switching thin film transistor disposed in a pixel area to control ON/OFF of the driving thin film transistor.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display apparatus includes a substrate including a display area and a non-display area disposed adjacent to the display area, a first thin film transistor disposed in the display area of the substrate, the first thin film transistor including a first semiconductor pattern including a first polysilicon, a first gate electrode overlapping with the first semiconductor pattern under a condition that a first gate insulating layer is interposed between the first gate electrode and the first semiconductor pattern, a first source electrode connected to the first semiconductor pattern, and a first drain electrode connected to the first semiconductor pattern, a second thin film transistor disposed in the display area of the substrate, the second thin film transistor including a second semiconductor pattern including a first oxide semiconductor, a second gate electrode overlapping with the second semiconductor pattern under a condition that a second gate insulating layer and a third gate insulating layer are interposed between the second gate electrode and the second semiconductor pattern, a second source electrode connected to the second semiconductor pattern, and a second drain electrode connected to the second semiconductor pattern, and a third thin film transistor disposed in the non-display area of the substrate, the third thin film transistor including a third semiconductor pattern including a second oxide semiconductor, a third gate electrode overlapping with the third semiconductor pattern under a condition that the third gate insulating layer is interposed between the third gate electrode and the third semiconductor pattern, and a third source electrode connected to the third semiconductor pattern, and a third drain electrode connected to the third semiconductor pattern.

In another aspect of the present disclosure, a display apparatus includes a substrate including a display area and a non-display area disposed adjacent to the display area, a first thin film transistor disposed in the display area of the substrate, the first thin film transistor including a first semiconductor pattern including a first oxide semiconductor, a first gate electrode overlapping with the first semiconductor pattern under a condition that a second gate insulating layer and a third gate insulating layer are interposed between the first gate electrode and the first semiconductor pattern, a first source electrode connected to the first semiconductor pattern, and a first drain electrode connected to the first semiconductor pattern, a second thin film transistor disposed in the display area of the substrate, the second thin film transistor including a second semiconductor pattern including a second oxide semiconductor, a second gate electrode overlapping with the second semiconductor pattern under a condition that the third gate insulating layer is interposed between the second gate electrode and the second semiconductor pattern, a second source electrode connected to the second semiconductor pattern, and a second drain electrode connected to the second semiconductor pattern, and a third thin film transistor disposed in the non-display area of the substrate, the third thin film transistor including a third semiconductor pattern including a polysilicon, a third gate electrode overlapping with the third semiconductor pattern under a condition that a first gate insulating layer is interposed between the third gate electrode and the third semiconductor pattern, and a third source electrode connected to the third semiconductor pattern, and a third drain electrode connected to the third semiconductor pattern.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings.

DETAILED DESCRIPTION

Figure 1:
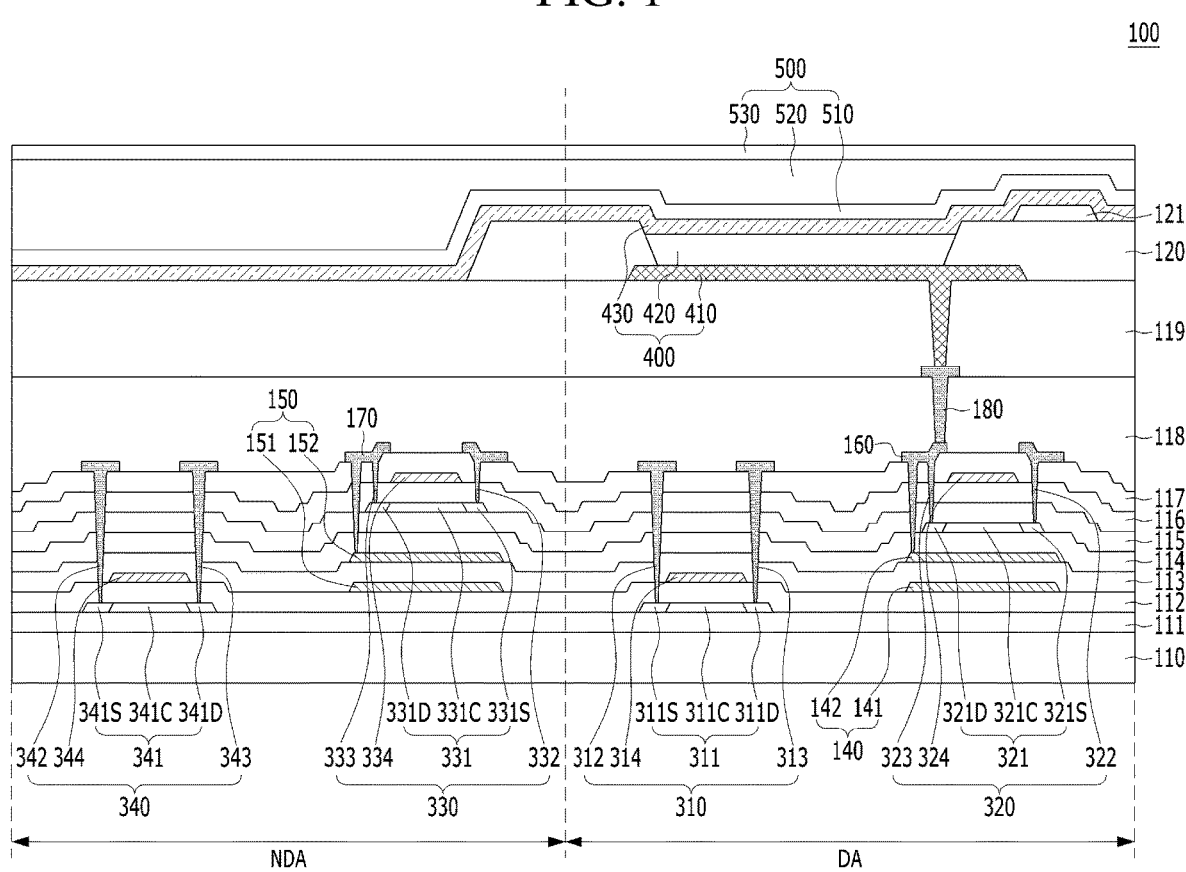
FIG. 1 is a sectional view illustrating a display apparatus according to an exemplary embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein.

Embodiments of the present disclosure are provided so that the present disclosure may be sufficiently thorough and complete to assist those skilled in the art in fully understanding the scope of the present disclosure. Therefore, the present disclosure may be embodied in different forms and should not be construed as limited to the embodiments set forth herein.

In the specification, in adding reference numerals for elements in each drawing, it should be noted that although the same constituent elements are shown in different drawings, the same reference numerals are used to denote the same constituent elements, wherever possible.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known art is determined to unnecessarily obscure the subject matter of the present disclosure, a detailed description thereof will be omitted. In the case where 'comprise', 'have', and 'include' described in the present specification are used, another part may be added unless 'only~' is used. The terms of a singular form may include plural forms unless referred to the contrary. If the term, "only" is used, then it means no other parts or structures are present. The terms of a singular form may include plural forms unless clearly stated otherwise.

In construing an element, the element is construed as including a tolerance or an error range, even if there is no explicit description.

In describing a positional relationship, for example, when the positional relationship is described as "upon . . . ", "above . . . ", "below . . . ", and "next to . . . ", one or more parts may be arranged between two other parts unless "just" or "direct" is used.

In describing a temporal relationship, for example, when the temporal order is described as "after . . . ", "subsequent to . . . ", "next to . . . ", and "before . . . ", a case which is not continuous may be included unless "just" or "direct" is used.

The term "at least one" should be understood as including any and all combinations of one or more of the associated listed items. For example, the meaning of "at least one of a first item, a second item, or a third item" denotes the combination of all items proposed from two or more of the first item, the second item, and the third item as well as the first item, the second item, or the third item.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, exemplary embodiments of the present disclosure will be described in detail with reference to the accompanying drawings.

FIG. 1 is a sectional view illustrating a display apparatus according to an exemplary embodiment of the present disclosure.

Referring to FIG. 1, the display apparatus, which is designated by reference numeral "100", may include a display area DA and a non-display area NDA which are defined on a substrate 110. The display area DA may be constituted by a plurality of pixels. Each pixel may be constituted by a first thin film transistor 310 and a second thin film transistor 320. The first thin film transistor 310 may include a polysilicon (poly-Si) material. For example, the first thin film transistor 310 may use low temperature polysilicon (LTPS) as a polysilicon material. On the other hand, the second thin film transistor 320 may include an oxide semiconductor material. The first thin film transistor 310, which includes a polysilicon (poly-Si) material, may be a switching thin film transistor (switching TFT) adapted to control operation of the second thin film transistor 320 which is a driving thin film transistor. In addition, the second thin film transistor 320, which includes an oxide semiconductor material, may be a driving thin film transistor (driving TFT) electrically connected to a first electrode 410 to supply current to a light emitting element 400. Of course, the present disclosure is not limited to the above-described conditions. For example, the first thin film transistor 310 including a polysilicon (poly-Si) material may be a driving thin film transistor, and the second thin film transistor 320 including an oxide semiconductor material may be a switching thin film transistor.

The non-display area NDA may be disposed adjacent to the display area DA. A driving circuit configured to drive the pixels of the display area DA may be disposed in the non-display area NDA. The driving circuit may include a third thin film transistor 330 and a fourth thin film transistor 340. The third thin film transistor 330 disposed in the non-display area NDA may include oxide semiconductor. On the other hand, the fourth thin film transistor 340 may include polysilicon (poly-Si).

The first thin film transistor 310 disposed in the display area DA may be constituted by a negative type thin film transistor (n-type TFT) or a positive type thin film transistor (p-type TFT). On the other hand, the second thin film transistor 320 disposed in the display area DA may be constituted by a negative type thin film transistor (n-type TFT). In addition, the fourth thin film transistor 340 disposed in the non-display area NDA may be constituted by a negative type thin film transistor (n-type TFT) or a positive type thin film transistor (p-type TFT). In addition, the third thin film transistor 330 disposed in the non-display area NDA may be constituted by a negative type thin film transistor (n-type TFT).

For example, the fourth thin film transistor 340, which is disposed in the non-display area NDA while including polysilicon, may be constituted by a positive type thin film transistor (p-type TFT). In this case, the first thin film transistor 310, which is disposed in the display area DA while including polysilicon, may also be constituted by a positive type thin film transistor (p-type TFT). In addition, the second thin film transistor 320, which is disposed in the display area DA while including an oxide semiconductor, and the third thin film transistor 330, which is disposed in the non-display area NDA while including an oxide semiconductor, may be constituted by negative type thin film transistors (n-type TFTs), respectively.

In another example, the fourth thin film transistor 340, which is disposed in the non-display area NDA while including polysilicon, may be constituted by a negative type thin film transistor (n-type TFT). In this case, the first thin film transistor 310, which is disposed in the display area DA while including polysilicon, may also be constituted by a negative type thin film transistor (n-type TFT). In addition, the second thin film transistor 320, which is disposed in the display area DA while including an oxide semiconductor, and the third thin film transistor 330, which is disposed in the non-display area NDA while including an oxide semiconductor, may be constituted by negative type thin film transistors (n-type TFTs), respectively.

Referring to FIG. 1, the display apparatus 100 according to the illustrated exemplary embodiment of the present disclosure may include the substrate 110, a first buffer layer 111, a first gate insulating layer 112, a first interlayer insulating layer 113, a second buffer layer 114, a second gate insulating layer 115, a third gate insulating layer 116, a second interlayer insulating layer 117, a first passivation layer 118, a second passivation layer 119, a bank layer 120, a spacer 121, a first storage capacitor 140, a second storage capacitor 150, a first connecting electrode 160, a second connecting electrode 170, an auxiliary electrode 180, a light emitting element 400, an encapsulator 500, the first thin film transistor 310, the second thin film transistor 320, the third thin film transistor 330, and the fourth thin film transistor 340.

The substrate 110 may support various constituent elements of the display apparatus 100. The substrate 110 may be made of glass or a plastic material having flexibility. For example, when the substrate 110 is made of a plastic material, polyimide (PI) may be used for the plastic material. When the substrate 110 is made of polyimide (PI), a process of manufacturing the display apparatus is carried out under the condition that a support substrate made of glass is disposed beneath the substrate 110. After completion of the manufacturing process, the support substrate may be released. After release of the support substrate, a back plate for supporting the substrate 110 may be disposed beneath the substrate 110.

When the substrate 110 is made of polyimide (PI), moisture components of polyimide may penetrate up to the first thin film transistor 310 or the light emitting element 400 via the substrate 110 and, as such, may degrade performance of the display apparatus. In order to avoid performance degradation caused by penetration of moisture, the substrate 110 may be made of double-layer polyimide. In this case, an inorganic insulating layer may be formed between two polyimide layers to reduce passing of moisture components through a lower one of the polyimide layers and, as such, reliability of the display apparatus may be enhanced.

In addition, when an inorganic insulating layer is formed between two polyimide layers, electric charges charged in the lower polyimide layer may form back bias, thereby causing the first thin film transistor 310 and the second thin film transistor 320 to be influenced by the back bias. Therefore, it is necessary to form a separate metal layer in order to block electric charges charged in the polyimide layers. However, in a display apparatus according to another embodiment of the present disclosure, an inorganic film is formed between two polyimide layers to block electric charges charged in the polyimide layers and, as such, reliability of the resultant product may be enhanced. The inorganic insulating layer may be constituted by a single layer made of silicon nitride ($SiN_x$) or silicon oxide ($SiO_x$) or multiple layers thereof. For example, the inorganic insulating layer may be made of silica or silicon dioxide ($SiO_2$). In addition, a process for forming a metal layer to block electric charges charged in polyimide may be omitted. Accordingly, process simplification and reduction in manufacturing costs may be achieved.

The first buffer layer 111 may be formed over the entire surface of the substrate 110. The first buffer layer 111 may be constituted by a single layer made of silicon nitride ($SiN_x$) or silicon oxide ($SiO_x$) or multiple layers thereof. In an exemplary embodiment of the present disclosure, the first buffer layer 111 may have a multilayer structure in which silicon nitride ($SiN_x$) layers and silicon oxide ($SiO_x$) layers are alternately formed. For example, the first buffer layer 111 may be constituted by n+1 layers. Here, n may be an even number including one of 0, 2, 4, 6, 8 . . . . When n is 0 (n=0), the first buffer layer 111 is formed by a single layer. In this case, the first buffer layer 111 may be made of silicon nitride ($SiN_x$) or silicon oxide ($SiO_x$). When n is 2 (n=2), the first buffer layer 111 is formed by triple layers. When the first buffer layer 111 is formed by triple layers, upper and lower layers thereof may be made of silicon oxide ($SiO_x$), and an intermediate layer between the upper and lower layers may be made of silicon nitride ($SiN_x$). In addition, when n is 4 (n=4), the first buffer layer 111 is formed by triple layers. When the first buffer layer 111 is formed by five layers.

When the first buffer layer 111 has a multilayer structure in which silicon nitride ($SiN_x$) layers and silicon oxide ($SiO_x$) layers are alternately formed, as described above, uppermost and lowermost layers of the first buffer layer 111 may be made of silicon oxide ($SiO_x$). For example, the first buffer layer 111, which is constituted by a plurality of layers, may include an upper layer contacting a first semiconductor pattern 311 of the first thin film transistor 310 and a fourth semiconductor pattern 341 of the fourth thin film transistor 340, a lower layer contacting the substrate 110, and an intermediate layer disposed between the upper layer and the lower layer. In this case, the upper layer and the lower layer may be made of silicon oxide ($SiO_x$). In addition, the upper layer of the first buffer layer 111, which has a multilayer structure, may be formed to have a greater thickness than the lower layer and the intermediate layer.

The first thin film transistor 310 and the fourth thin film transistor 340 may be disposed on the first buffer layer 111.

The first thin film transistor 310 disposed in the display area DA may include a first semiconductor pattern 311, a first gate electrode 314, a first source electrode 312, and a first drain electrode 313. The first source electrode 312 may become a drain electrode, and the first drain electrode 313 may become a source electrode without being limited to the above-described conditions. The fourth thin film transistor 340 disposed in the non-display area NDA may include a fourth semiconductor pattern 341, a fourth gate electrode 344, a fourth source electrode 342, and a fourth drain electrode 343. The fourth source electrode 342 may become a drain electrode, and the fourth drain electrode 343 may become a source electrode without being limited to the above-described condition.

The first semiconductor pattern 311 of the first thin film transistor 310 and the fourth semiconductor pattern 341 of the fourth thin film transistor 340 may be disposed on the first buffer layer 111. The first semiconductor pattern 311 may be disposed in the display area DA, whereas the fourth semiconductor pattern 341 may be disposed in the non-display area NDA. The first semiconductor pattern 311 and the fourth semiconductor pattern 341 may include polysilicon (poly-Si). For example, the first semiconductor pattern 311 and the fourth semiconductor pattern 341 may include low-temperature polysilicon (LTPS).

Polysilicon materials exhibit low energy consumption and excellent reliability because the mobility thereof is high (100 $cm^2Vs$ or more) and, as such, may be applied to a gate driver and/or a multiplexer (MUX) for a driving device adapted to drive thin film transistors for a display device. In addition, such a polysilicon material may be applied to a semiconductor pattern of a switching thin film transistor in the display apparatus according to the exemplary embodiment of the present disclosure without being limited thereto. For example, such a polysilicon material may be applied to a semiconductor pattern of a driving thin film transistor.

In accordance with an exemplary embodiment of the present disclosure, the first semiconductor pattern 311 of the first thin film transistor 310 disposed in the display area DA may be applied to a semiconductor pattern of a switching thin film transistor. In addition, the fourth semiconductor pattern 341 of the fourth thin film transistor 340 disposed in the non-display area NDA may be applied to a semiconductor pattern of a thin film transistor for gate signals. The thin film transistor for gate signals may be a switching thin film transistor configured to perform a switching function.

A polysilicon layer may be formed on the first buffer layer 111 by depositing an amorphous silicon (a-Si) material on the first buffer layer 111, and performing a crystallization process for the deposited amorphous silicon material. The first semiconductor pattern 311 and the fourth semiconductor pattern 341 may be formed by patterning the polysilicon layer.

The first semiconductor pattern 311 formed in the display area DA may include a first channel region 311C, at which a channel may be formed during driving of the first thin film transistor 310, and a first source region 311S and a first drain region 311D respectively disposed at opposite sides of the first channel region 311C. The first source region 311S may be a portion of the first semiconductor pattern 311 connected to the first source electrode 312, and the first drain region 311D may be a portion of the first semiconductor pattern 311 connected to the first drain electrode 313. The first source region 311S and the first drain region 311D may be formed through ion doping (impurity doping) of the first semiconductor pattern 311. The first source region 311S and the first drain region 311D may be formed by doping a polysilicon material with ions. The first channel region 311C may be a residual portion of the polysilicon material in which no ion is doped.

The fourth semiconductor pattern 341 formed in the non-display area may include a fourth channel region 341C, in which a channel is formed during driving of the fourth thin film transistor 340, and a fourth source region 341S and a fourth drain region 341D respectively disposed at opposite sides of the fourth channel region 341C. The fourth source region 341S may be a portion of the fourth semiconductor pattern 341 connected to the fourth source electrode 342, and the fourth drain region 341D may be a portion of the fourth semiconductor pattern 341 connected to the fourth drain electrode 343. The fourth source region 341S and the fourth drain region 341D may be formed through ion doping (impurity doping) of the fourth semiconductor pattern 341. The fourth source region 341S and the fourth drain region 341D may be formed by doping ions in a polysilicon material. The fourth channel region 341C may be a residual portion of the polysilicon material in which no ion is doped.

A first gate insulating film 112 may be disposed on the first semiconductor pattern 311 of the first thin film transistor 310 and the fourth semiconductor pattern 341 of the fourth thin film transistor 340. The first gate insulating layer 112 may be constituted by a single layer of silicon nitride ($SiN_x$) or silicon oxide ($SiO_x$) or multiple layers thereof.

On the first gate insulating layer 112, the first gate electrode 314 of the first thin film transistor 310, the fourth gate electrode 344 of the fourth thin film transistor 340, a first storage lower electrode 141 of the first storage capacitor 140 and a second storage lower electrode 151 of the second storage capacitor 150 may be disposed.

The first gate electrode 314, the fourth gate electrode 344, the first storage lower electrode 141 and the second storage lower electrode 151 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof. The first gate electrode 314, the fourth gate electrode 344, the first storage lower electrode 141 and the second storage lower electrode 151 may be made of the same material.

The first gate electrode 314 may be disposed in the display area DA while overlapping with the first channel area 311C of the first semiconductor pattern 311 under the condition that the first gate insulating layer 112 is interposed between the first gate electrode 314 and the first channel region 311C. The fourth gate electrode 444 may be disposed in the non-display area NDA while overlapping with the fourth channel region 341C of the fourth semiconductor pattern 341 under the condition that the first gate insulating layer 112 is interposed between the fourth gate electrode 444 and the fourth channel region 341C. In addition, the first storage lower electrode 141 may be disposed in the display area DA, whereas the second storage lower electrode 151 may be disposed in the non-display area NDA.

The first interlayer insulating layer 113 may be disposed on the first gate insulating layer 112, the first gate electrode 314, the fourth gate electrode 344, the first storage lower electrode 141 and the second storage lower electrode 151. The first interlayer insulating layer 113 may be constituted by a single layer made of silicon nitride ($SiN_x$) or silicon oxide ($SiO_x$) or multiple layers thereof.

A first storage upper electrode 142 of the first storage capacitor 140 and a second storage upper electrode 152 of the second storage capacitor 150 may be disposed on the first interlayer insulating layer 113. The first storage upper electrode 142 and the second storage upper electrode 152 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof. The first storage upper electrode 142 may overlap with the first storage lower electrode 141 under the condition that the first interlayer insulating layer 113 is interposed between the first storage upper electrode 142 and the first storage lower electrode 141. The second storage upper electrode 152 may overlap with the second storage lower electrode 151 under the condition that the first interlayer insulating layer 113 is interposed between the second storage upper electrode 152 and the second storage lower electrode 151.

In addition, the first storage upper electrode 142 and the second storage upper electrode 152 may be made of the same material as the first storage lower electrode 141 and the second storage lower electrode 151.

The first storage lower electrode 141 of the first storage capacitor 140 and the second storage lower electrode 151 of the second storage capacitor 150 may be omitted on the basis of driving characteristics of the display apparatus and structures and types of the thin film transistors. For example, the first storage upper electrode 142 of the first storage capacitor 140 may be disposed to overlap with the first gate electrode of the first thin film transistor 310. In this case, the first gate electrode 314 may perform the same function as the first storage lower electrode 141. Accordingly, the first storage lower electrode 141 may be omitted. The second storage upper electrode 152 of the second storage capacitor 150 may be disposed to overlap with the fourth gate electrode 344 of the fourth thin film transistor 340. In this case, the fourth gate electrode 344 may perform the same function as the second storage lower electrode 151. Accordingly, the second storage lower electrode 151 may be omitted.

The second buffer layer 114 may be disposed on the first interlayer insulating layer 113, the first storage upper electrode 142 and the second storage upper electrode 152. The second buffer layer 114 may be constituted by a single layer made of silicon nitride ($SiN_x$) or silicon oxide ($SiO_x$) or multiple layers thereof.

The second semiconductor pattern 321 of the second thin film transistor 320 may be formed on the second buffer layer 114. The second semiconductor pattern 321 may be disposed in the display area DA while overlapping with the first storage capacitor 140. The second semiconductor pattern 321 may be an oxide semiconductor pattern made of an oxide semiconductor. The second thin film transistor 320 may include the second semiconductor pattern 321, a second gate electrode 324, a second source electrode 322, and a second drain electrode 323. Alternatively, the second source electrode 322 may become a drain electrode, and the second drain electrode 323 may become a source electrode.

The second semiconductor pattern 321 may include a second channel region 321C, at which a channel may be formed during driving of the second thin film transistor 320, and a second source region 321S and a second drain region 321D respectively disposed at opposite sides of the second channel region 321C. The second source region 321S may be a portion of the second semiconductor pattern 321 connected to the second source electrode 322, and the second drain region 321D may be a portion of the second semiconductor pattern 321 connected to the second drain electrode 323.

The oxide semiconductor material of the second semiconductor pattern 321 exhibits a higher band gap than a polysilicon material and, as such, exhibits low off-current because electrons cannot overflow the band gap in an OFF state. For this reason, a thin film transistor including an active layer made of an oxide semiconductor may be suitable for a switching thin film transistor having a short ON time while maintaining a long OFF time, without being limited thereto. For example, such a thin film transistor may be applied to a driving thin film transistor. Since the thin film transistor may be reduced in auxiliary capacity by virtue of low off-current, the thin film transistor may be suitable for a high-resolution display device. Referring to FIG. 1, the second thin film transistor 320 including an oxide semiconductor may be a driving thin film transistor electrically connected to the first electrode 410 to supply current to the light emitting element 400.

The second gate insulating layer 115 may be formed on the second semiconductor pattern 321 and the second buffer layer 114. The second gate insulating layer 115 may be constituted by a single layer made of silicon nitride ($SiN_x$) or silicon oxide ($SiO_x$) or multiple layers thereof.

The third semiconductor pattern 331 may be disposed in the non-display area NDA while overlapping with the second storage capacitor 150. The third semiconductor pattern 331 may be an oxide semiconductor pattern made of an oxide semiconductor. The third thin film transistor 330 may include the third semiconductor pattern 331, a third gate electrode 334, a third source electrode 332, and a third drain electrode 333. Alternatively, the third source electrode 332 may become a drain electrode, and the third drain electrode 333 may become a source electrode.

The third semiconductor pattern 331 may include a third channel region 331C, at which a channel may be formed during driving of the third thin film transistor 330, and a third source region 331S and a third drain region 331D respectively disposed at opposite sides of the third channel region 331C. The third source region 331S may be a portion of the third semiconductor pattern 331 connected to the third source electrode 332, and the third drain region 331D may be a portion of the third semiconductor pattern 331 connected to the third drain electrode 333.

The oxide semiconductor material of the third semiconductor pattern 331 exhibit a higher band gap than a polysilicon material and, as such, exhibits low off-current because electrons cannot overflow the band gap in an OFF state. For this reason, a thin film transistor including an active layer made of an oxide semiconductor may be suitable for a switching thin film transistor having a short ON time while maintaining a long OFF time, without being limited thereto. For example, such a thin film transistor may be applied to a driving thin film transistor. Since the thin film transistor may be reduced in auxiliary capacity by virtue of low off-current, the thin film transistor may be suitable for a high-resolution display device. Referring to FIG. 1, the third semiconductor pattern 331 including an oxide semiconductor may be applied to a semiconductor pattern of a thin film transistor for gate signals in a display apparatus. The thin film transistor for gate signals may be a switching thin film transistor configured to perform a switching function.

The second semiconductor pattern 321 and the third semiconductor pattern 331 may be made of metal oxide. For example, the second semiconductor pattern 321 and the third semiconductor pattern 331 may be made of various metal oxide such as indium gallium zinc oxide (IGZO). Although the second semiconductor pattern 321 and the third semiconductor pattern 331 have been described as being made of IGZO among various metal oxides, the present disclosure is not limited thereto. For example, the second semiconductor pattern 321 and the third semiconductor pattern 331 may be made of indium zinc oxide (IZO), indium gallium tin oxide (IGTO) or indium gallium oxide (IGO) other than IGZO.

As illustrated in FIG. 1, the third gate insulating layer 116 may be formed on the second gate insulating layer 115 and the third semiconductor pattern 331 of the third thin film transistor 330 disposed in the non-display area NDA. The third gate insulating layer 116 may be constituted by a single layer made of silicon nitride ($SiN_x$) or silicon oxide ($SiO_x$) or multiple layers thereof.

The second gate electrode 324 and the third gate electrode 334 may be formed on the third gate insulating layer 116. The second gate electrode 324 disposed in the display area DA may overlap with the second channel area 321C of the second semiconductor pattern 321 under the condition that the second gate insulating layer 115 and the third gate insulating layer 116 are interposed between the second gate electrode 324 and the second channel area 321C. In addition, the third gate electrode 334 disposed in the non-display area NDA may overlap with the third channel region 331C of the third semiconductor pattern 331 under the condition that the third gate insulating layer 116 is interposed between the third gate electrode 334 and the third channel region 331C.

Thus, the gate insulating layer stacked between the second gate electrode 324 and the second semiconductor pattern 321 in the second thin film transistor 320 disposed in the display area DA may be constituted by a stacked structure of the second gate insulating layer 115 and the third gate insulating layer 116. In addition, the gate insulating layer stacked between the third gate electrode 334 and the third semiconductor pattern 331 in the third thin film transistor 330 disposed in the non-display area NDA may be constituted by the third gate insulating layer 116.

As such, the thickness of the gate insulating layer disposed between the second semiconductor pattern 321 and the second gate electrode 324 may be greater than the thickness of the gate insulating layer disposed between the third semiconductor pattern 331 and the third gate electrode 334. As the thickness of a gate insulating layer increases, leakage of current may be reduced. Accordingly, a thin film transistor including a thick gate insulating layer may be used as a driving thin film transistor for controlling an amount of current. Since a switching thin film transistor performs a switching function for controlling turn-on or turn-off, leakage of current therein may not cause a significant problem. In this regard, the thickness of a gate insulating layer in a thin film transistor performing a switching function may be smaller than the thickness of a gate insulating layer in a thin film transistor used as a driving thin film transistor.

As apparent from the above description, when the gate insulating layer of a thin film transistor is formed to have a large thickness, there may be an advantage in that leakage of current is reduced and, as such, an amount of current may be effectively controlled. However, when the thickness of the gate insulating layer of the thin film transistor increases, characteristics of a switching function may be degraded due to a decrease in mobility. On the other hand, when the gate insulating layer of the thin film transistor has a relatively small thickness, there may be an advantage in that characteristics of a switching function may be enhanced due to an increase in mobility. However, as the thickness of the gate insulating layer decreases, current leakage increases, thereby causing characteristics of a current amount control function to be degraded. Therefore, in the display apparatus 100 according to the exemplary embodiment of the present disclosure, the thickness of the gate insulating layer may be designed to be varied in accordance with characteristics of the thin film transistor. Accordingly, the display apparatus 100 may include thin film transistors having different mobilities.

Referring to FIG. 1, the second thin film transistor 320 used as a driving thin film transistor may include a gate insulating layer thicker than the third thin film transistor 330 performing a switching function as a thin film transistor for gate signals. Accordingly, the thickness of the gate insulating layer disposed between the second semiconductor pattern 321 and the second gate electrode 324 may be greater than the thickness of the gate insulating layer disposed between the third semiconductor pattern 331 and the third gate electrode 334. For example, as illustrated in FIG. 1, the gate insulating layer stacked between the second gate electrode 324 and the second semiconductor pattern 321 in the second thin film transistor 320 may be constituted by a stacked structure of the second gate insulating layer 115 and the third gate insulating layer 116. In addition, the gate insulating layer stacked between the third gate electrode 334 and the third semiconductor pattern 331 in the third thin film transistor 330 may be constituted by the third gate insulating layer 116.

The second gate electrode 324 and the third gate electrode 334 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof. The second gate electrode 324 and the third gate electrode 334 may be made of the same material.

The second interlayer insulating layer 117 may be formed on the second gate electrode 324, the third gate electrode 334, and the third gate insulating layer 116.

The second interlayer insulating layer 117 may be constituted by a single layer made of silicon nitride ($SiN_x$) or silicon oxide ($SiO_x$) or multiple layers thereof.

Contact holes may be formed to expose the first semiconductor pattern 311 of the first thin film transistor 310 and the fourth semiconductor pattern 341 of the fourth thin film transistor 340 by etching the second interlayer insulating layer 117, the third gate insulating layer 116, the second gate insulating layer 115, the second buffer layer 114, the first interlayer insulating layer 113 and the first gate insulating layer 112. For example, contact holes may be formed to expose the first source region 311S and the first drain region 311D in the first semiconductor pattern 311, respectively, by etching the second interlayer insulating layer 117, the third gate insulating layer 116, the second gate insulating layer 115, the second buffer layer 114, the first interlayer insulating layer 113 and the first gate insulating layer 112. In addition, contact holes may be formed to expose the fourth source region 341S and the fourth drain region 341D in the fourth semiconductor pattern 341, respectively.

Contact holes may be formed to expose the second semiconductor pattern 321 of the second thin film transistor 320 by etching the second interlayer insulating layer 117, the third gate insulating layer 116 and the second gate insulating layer 115. For example, contact holes may be formed to expose the second source region 321S and the second drain region 321D in the second semiconductor pattern 321, respectively.

In addition, contact holes may be formed to expose the third semiconductor pattern 331 of the third thin film transistor 330 by etching the second interlayer insulating layer 117 and the third gate insulating layer 116. For example, contact holes may be formed to expose the third source region 331S and the third drain region 331D in the third semiconductor pattern 331, respectively, by etching the second interlayer insulating layer 117 and the third gate insulating layer 116.

Furthermore, contact holes may be formed to expose the first storage upper electrode 142 and the second storage upper electrode 152, respectively, by etching the second interlayer insulating layer 117, the third gate insulating layer 116, the second gate insulating layer 115 and the second buffer layer 114.

On the second interlayer insulating layer 117, the first connecting electrode 160, the second connecting electrode 170, the first source electrode 312, and the first drain electrode 313 of the first thin film transistor 310, the second source electrode 322 and the second drain electrode 323 of the second thin film transistor 320, the third source electrode 332 and the third drain electrode 333 of the third thin film transistor 330, and the fourth source electrode 342 and the fourth drain electrode 343 of the fourth thin film transistor 340 may be disposed.

The first source electrode 312 and the first drain electrode 313 of the first thin film transistor 310 may be connected to the first source region 311S and the first drain region 311D of the first semiconductor pattern 311 via the contact holes formed through the second interlayer insulating layer 117, the third gate insulating layer 116, the second gate insulating layer 115, the second buffer layer 114, the first interlayer insulating layer 113 and the first gate insulating layer 112, respectively.

In addition, the second source electrode 322 and the second drain electrode 323 of the second thin film transistor 320 may be connected to the second source region 321S and the second drain region 321D of the second semiconductor pattern 321 via the contact holes formed through the second interlayer insulating layer 117, the third gate insulating layer 116, the second gate insulating layer 115, the second buffer layer 114, the first interlayer insulating layer 113 and the first gate insulating layer 112, respectively.

Furthermore, the third source electrode 332 and the third drain electrode 333 of the third thin film transistor 330 may be connected to the third source region 331S and the third drain region 331D of the third semiconductor pattern 331 via the contact holes formed through the second interlayer insulating layer 117 and the third gate insulating layer 116, respectively.

In addition, the fourth source electrode 342 and the fourth drain electrode 343 of the fourth thin film transistor 340 may be connected to the fourth source region 341S and the fourth drain region 341D of the fourth semiconductor pattern 341 via the contact holes formed through the second interlayer insulating layer 117, the third gate insulating layer 116, the second gate insulating layer 115, the second buffer layer 114, the first interlayer insulating layer 113 and the first gate insulating layer 112, respectively.

In addition, the first connecting electrode 160 disposed in the display area DA may be connected to the first storage upper electrode 142 of the first storage capacitor 140 via the contact hole formed through the second interlayer insulating layer 117, the third gate insulating layer 116, the second gate insulating layer 115 and the second buffer layer 114. Furthermore, the first connecting electrode 160 may be electrically connected to the second drain electrode 323 of the second thin film transistor 320. Alternatively, the first connecting electrode 160 may be connected to the second source electrode 322 of the second thin film transistor 320. The first connecting electrode 160 may be connected to the second drain electrode 323 of the second thin film transistor 320 while forming an integrated structure with the second drain electrode 323. Alternatively, the first connecting electrode 160 may be connected to the second source electrode 322 of the second thin film transistor 320 while forming an integrated structure with the second source electrode 322.

In addition, the second connecting electrode 170 disposed in the non-display area DA may be connected to the second storage upper electrode 152 of the second storage capacitor 150 via the contact hole formed through the second interlayer insulating layer 117, the third gate insulating layer 116, the second gate insulating layer 115 and the second buffer layer 114. Furthermore, the second connecting electrode 170 may be electrically connected to the third drain electrode 333 of the third thin film transistor 330. Alternatively, the second connecting electrode 170 may be connected to the third source electrode 332 of the third thin film transistor 330. The second connecting electrode 170 may be connected to the third drain electrode 333 of the third thin film transistor 330 while forming an integrated structure with the third drain electrode 333. Alternatively, the second connecting electrode 170 may be connected to the third source electrode 332 of the third thin film transistor 330 while forming an integrated structure with the third source electrode 332.

The first connecting electrode 160, the second connecting electrode 170, the first source electrode 312, and the first drain electrode 313 of the first thin film transistor 310, the second source electrode 322 and the second drain electrode 323 of the second thin film transistor 320, the third source electrode 332 and the third drain electrode 333 of the third thin film transistor 330 and the fourth source electrode 342 and the fourth drain electrode 343 of the fourth thin film transistor 340 may be made of the same material, and may be disposed on the same layer. For example, as illustrated in FIG. 1, the first connecting electrode 160, the second connecting electrode 170, the first source electrode 312 and the first drain electrode 313 of the first thin film transistor 310, the second source electrode 322 and the second drain electrode 323 of the second thin film transistor 320, the third source electrode 332 and the third drain electrode 333 of the third thin film transistor 330 and the fourth source electrode 342 and the fourth drain electrode 343 of the fourth thin film transistor 340 may be disposed to contact an upper surface of the second interlayer insulating layer 117, and may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof.

The first passivation layer 118 may be formed on the first connecting electrode 160, the second connecting electrode 170, the first source electrode 312 and the first drain electrode 313 of the first thin film transistor 310, the second source electrode 322 and the second drain electrode 323 of the second thin film transistor 320, the third source electrode 332 and the third drain electrode 333 of the third thin film transistor 330 and the fourth source electrode 342 and the fourth drain electrode 343 of the fourth thin film transistor 340.

A contact hole may be formed through the first passivation layer 118 to expose the second drain electrode 323 of the second thin film transistor 320. However, the present disclosure is not limited to the above-described condition. A contact hole may be formed through the first passivation layer 118 to expose the second source electrode 322 of the second thin film transistor 320. The first passivation layer 118 may be an organic material layer. For example, the first passivation layer 118 may be made of an organic material such as acryl resin, epoxy resin, phenolic resin, polyamide resin, or polyimide resin. Alternatively, the first passivation layer 118 may be constituted by a single layer made of silicon nitride ($SiN_x$) or silicon oxide ($SiO_x$) or multiple layers thereof.

The auxiliary electrode 180 may be disposed on the first passivation layer 118. In addition, the auxiliary electrode 180 may be connected to the second drain electrode 323 of the second thin film transistor 320 via the contact hole of the first passivation layer 118. The auxiliary electrode 180 may electrically connect the second thin film transistor 320 and the first electrode 410. The auxiliary electrode 180 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof. The auxiliary electrode 180 may be made of the same material as the second source electrode 322 and the second drain electrode 323 of the second thin film transistor 320.

The second passivation layer 119 may be disposed on the auxiliary electrode 180 and the first passivation layer 118. In addition, as illustrated in FIG. 1, a contact hole may be formed through the second passivation layer 119 to expose the auxiliary electrode 180. The second passivation layer 119 may be an organic material layer. For example, the second passivation layer 119 may be made of an organic material such as acryl resin, epoxy resin, phenolic resin, polyamide resin, or polyimide resin.

The first electrode 410 of the light emitting element 400 may be disposed on the second passivation layer 119. The first electrode 410 may be electrically connected to the auxiliary electrode 180 via the contact hole formed through the second passivation layer 119. Accordingly, the first electrode 410 may be electrically connected to the second thin film transistor 320 in accordance with connection thereof to the auxiliary electrode 180 via the contact hole formed through the second passivation layer 119. The first electrode 410 may be formed to have a multilayer structure including a transparent conductive film and an opaque conductive film having high reflection efficiency. The transparent conductive film may be made of a material having a relatively great work function value such as indium tin oxide (ITO) or indium zinc oxide (IZO). The opaque conductive film may be formed by a single layer or multiple layers including aluminum (Al), silver (Ag), copper (Cu), lead (Pb), molybdenum (Mo), titanium (Ti) or an alloy thereof. For example, the first electrode 410 may be formed through sequential formation of a transparent conductive film, an opaque conductive film and a transparent conductive film. Of course, the present disclosure is not limited to the above-described condition. For example, a transparent conductive film and an opaque conductive film may be sequentially formed.

The display apparatus according to the exemplary embodiment of the present disclosure is a top emission display apparatus and, as such, the first electrode 410 may be an anode. When the display apparatus is of a bottom emission type, the first electrode 410 disposed on the second passivation layer 119 may be a cathode.

The bank layer 120 may be disposed on the first electrode 410 and the second passivation layer 119. An opening may be formed through the bank layer 120 to expose the first electrode 410. The bank layer 120 may define a light emission area of the display apparatus and, as such, may be referred to as a "pixel definition film". The spacer 121 may further be disposed on the bank layer 120. In addition, a light emitting layer 420 of the light emitting element 400 may further be disposed on the first electrode 410.

The light emitting layer 420 may be formed on the first electrode 410 in an order of a hole layer HL, an emission material layer EML, and an electron layer EL or a reversed order thereof.

Alternatively, the light emitting layer 420 may include a first light emitting layer and a second light emitting layer under the condition that a charge generation layer CGL is interposed between the first light emitting layer and the second light emitting layer. In this case, one emission material layer of the first and second light emitting layers may generate blue light, and the other emission material layer of the first and second light emitting layers may generate yellow-green light and, as such, white light may be generated through the first and second light emitting layers. The white light generated through the first and second light emitting layers may be incident upon a color filter disposed above the light emitting layers and, as such, a color image may be realized. Alternatively, a color image may be realized as each light emitting layer generates colored light corresponding to each sub-pixel without use of a separate color filter. That is, the light emitting layer of a red (R) sub-pixel may generate red light, the light emitting layer of a green (G) sub-pixel may generate green light, and the light emitting layer of a blue (B) sub-pixel may generate blue light.

Referring to FIG. 1, a second electrode 430 of the light emitting element 400 may further be disposed on the light emitting layer 420. The second electrode 430 may overlap with the first electrode 410 under the condition that the light emitting layer 420 is interposed between the second electrode 430 and the first electrode 410. In the display apparatus according to the exemplary embodiment of the present disclosure, the second electrode 430 may be a cathode.

The encapsulator 500 may be disposed on the second electrode 430 to suppress penetration of moisture. The encapsulator 500 may include a first encapsulation layer 510, a second encapsulation layer 520, and a third encapsulation layer 530. The second encapsulation layer 520 may include a material different from those of the first and third encapsulation layers 510 and 530. For example, each of the first encapsulation layer 510 and the third encapsulation layer 530 may be an inorganic insulating film made of an inorganic insulating material, whereas the second encapsulation layer 520 may be an organic insulating film made of an organic insulating material. The first encapsulation layer 510 of the encapsulator 500 may be disposed on the second electrode 430. The second encapsulation layer 520 may be disposed on the first encapsulation layer 510. In addition, the third encapsulation layer 530 may be disposed on the second encapsulation layer 520.

The first and third encapsulation layers 510 and 530 of the encapsulator 500 may be made of an inorganic material such as silicon nitride ($SiN_x$) or silicon oxide ($SiO_x$). The second encapsulation layer 520 of the encapsulator 500 may be made of an organic material such as acryl resin, epoxy resin, phenolic resin, polyamide resin, or polyimide resin.

Figure 2:
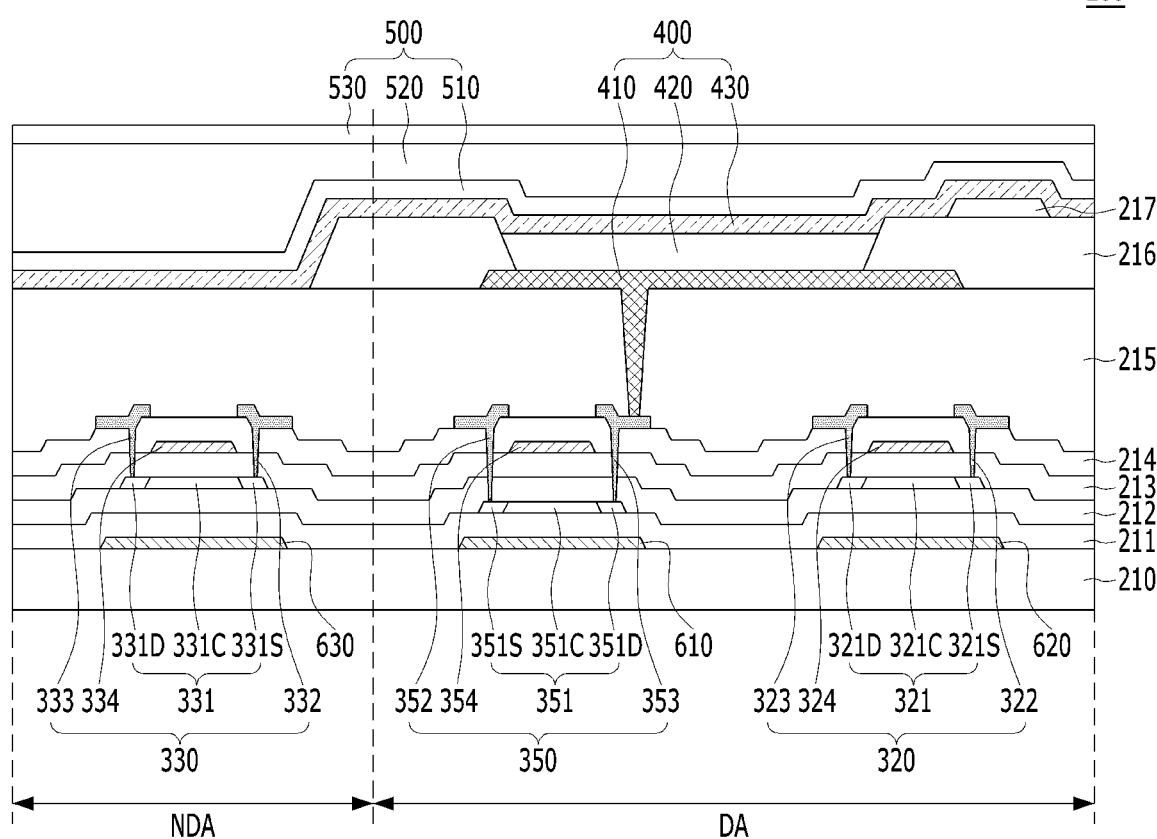
FIG. 2 is a sectional view of a display apparatus according to another exemplary embodiment of the present disclosure.

FIG. 2 is a sectional view of a display apparatus according to another exemplary embodiment of the present disclosure.

Referring to FIG. 2, the display area DA of a substrate 210 in a display apparatus 200 may be constituted by a plurality of pixels. Each pixel may be constituted by a first thin film transistor 350 and a second thin film transistor 320. Each of the first and second thin film transistors 350 and 320 may include an oxide semiconductor material. Of course, the present disclosure is not limited to the above-described condition, and each pixel may further include a thin film transistor including a polysilicon material, as in the case of FIG. 1. The following description associated with FIG. 2 will be given mainly in conjunction with the second thin film transistor 320, which is a switching thin film transistor, and the first thin film transistor 350, which is a driving thin film transistor, among thin film transistors made of an oxide semiconductor.

A non-display area NDA may be disposed adjacent to the display area DA in the substrate 210. A driving circuit configured to drive the pixels of the display area DA may be disposed in the non-display area NDA. The driving circuit may include a third thin film transistor 330. The third thin film transistor 330 disposed in the non-display area NDA may include oxide semiconductor.

Each of the first thin film transistor 350 and the second thin film transistor 320 disposed in the display area DA may be constituted by a negative type thin film transistor (n-type TFT). In addition, the third thin film transistor 330 disposed in the non-display area NDA may be constituted by a negative type thin film transistor (n-type TFT).

Referring to FIG. 2, the display apparatus 200 according to another exemplary embodiment of the present disclosure may include the substrate 210, a buffer layer 211, a first gate insulating layer 212, a second gate insulating layer 213, an interlayer insulating layer 214, a passivation layer 215, a bank layer 216, a spacer 217, a first metal pattern 610, a second metal pattern 620, a third metal pattern 630, a light emitting element 400, an encapsulator 500, the first thin film transistor 350, the second thin film transistor 320, and the third thin film transistor 330.

The substrate 210 may support various constituent elements of the display apparatus 200. The substrate 210 may be made of glass or a plastic material having flexibility. For example, when the substrate 210 is made of a plastic material, the substrate 210 may be made of polyimide (PI). When the substrate 210 is made of polyimide (PI), moisture components may penetrate up to the first thin film transistor 350, the second thin film transistor 320, the third thin film transistor 330 or the light emitting element 400 after emerging from the substrate 210 made of polyimide (PI) and, as such, may degrade performance of the display apparatus.

In order to avoid performance degradation caused by penetration of moisture in the display apparatus 200 according to the exemplary embodiment of the present disclosure, the first metal pattern 610, the second metal pattern 620 and the third metal pattern 630 may be formed on the substrate 210.

In addition, the first metal pattern 610, the second metal pattern 620 and the third metal pattern 630 may have a light shield function for reducing external light from being incident upon semiconductor patterns of the first thin film transistor 350, the second thin film transistor 320 and the third thin film transistor 330.

Accordingly, as illustrated in FIG. 2, the first metal pattern 610 may overlap with a first semiconductor pattern 351 of the first thin film transistor 350. In addition, the second metal pattern 620 may overlap with a second semiconductor pattern 321 of the second thin film transistor 320. Furthermore, the third metal pattern 630 may overlap with a third semiconductor pattern 331 of the third thin film transistor 330. The first metal pattern 610, the second metal pattern 620 and the third metal pattern 630 may be made of the same material, and may be formed on the same layer. In addition, the first metal pattern 610, the second metal pattern 620 and the third metal pattern 630 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof.

The buffer layer 211 may be formed on the first metal pattern 610, the second metal pattern 620 and the third metal pattern 630. The buffer layer 211 may be constituted by a single layer made of silicon nitride ($SiN_x$) or silicon oxide ($SiO_x$) or multiple layers thereof. In an exemplary embodiment of the present disclosure, the buffer layer 211 may have a multilayer structure in which silicon nitride ($SiN_x$) layers and silicon oxide ($SiO_x$) layers are alternately formed.

When the buffer layer 211 has a multilayer structure in which silicon nitride ($SiN_x$) layers and silicon oxide ($SiO_x$) layers are alternately formed, as described above, uppermost and lowermost layers of the buffer layer 211 may be made of silicon oxide ($SiO_x$).

The first thin film transistor 350 may be disposed on the buffer layer 211. The first thin film transistor 350 may be disposed in the display area DA of the display apparatus 200.

The first thin film transistor 350 disposed in the display area DA may include a first semiconductor pattern 351, a first gate electrode 354, a first source electrode 352, and a first drain electrode 353. The first source electrode 352 may become a drain electrode, and the first drain electrode 353 may become a source electrode without being limited to the above-described conditions.

Referring to FIG. 2, the first semiconductor pattern 351 of the first thin film transistor 350 may be formed on the buffer layer 211. The first semiconductor pattern 351 may be disposed in the display area DA while overlapping with the first metal pattern 610. The first semiconductor pattern 351 may be an oxide semiconductor pattern made of an oxide semiconductor. The first thin film transistor 350 may include the first semiconductor pattern 351, the first gate electrode 354, the first source electrode 352, and the first drain electrode 353. Alternatively, the first source electrode 352 may become a drain electrode, and the first drain electrode 353 may become a source electrode.

The first semiconductor pattern 351 may include a first channel region 351C, at which a channel may be formed during driving of the first thin film transistor 350, and a first source region 351S and a first drain region 351D respectively disposed at opposite sides of the first channel region 351C.

Referring to FIG. 2, the first thin film transistor 350 including an oxide semiconductor may be a driving thin film transistor configured to supply current to the light emitting element 400.

The first gate insulating layer 212 may be formed on the first semiconductor pattern 351 and the buffer layer 211. The first gate insulating layer 212 may be constituted by a single layer of silicon nitride ($SiN_x$) or silicon oxide ($SiO_x$) or multiple layers thereof.

The second semiconductor pattern 321 of the second thin film transistor 320 and the third semiconductor pattern 331 of the third thin film transistor 330 may be disposed on the first gate insulating layer 212.

The second semiconductor pattern 321 may be disposed in the display area DA while overlapping with the second metal pattern 620. The second semiconductor pattern 321 may be an oxide semiconductor pattern made of an oxide semiconductor. The second thin film transistor 320 may include the second semiconductor pattern 321, a second gate electrode 324, a second source electrode 322, and a second drain electrode 323. Alternatively, the second source electrode 322 may become a drain electrode, and the second drain electrode 323 may become a source electrode.

The second semiconductor pattern 321 may include a second channel region 321C, at which a channel may be formed during driving of the second thin film transistor 320, and a second source region 321S and a second drain region 321D respectively disposed at opposite sides of the second channel region 321C.

Referring to FIG. 2, the second thin film transistor 320 including an oxide semiconductor may be a switching thin film transistor.

The third semiconductor pattern 331 of the third thin film transistor 330 may be disposed in the non-display area NDA while overlapping with the third metal pattern 630. The third semiconductor pattern 331 may be an oxide semiconductor pattern made of an oxide semiconductor. The third thin film transistor 330 may include the third semiconductor pattern 331, a third gate electrode 334, a third source electrode 332, and a third drain electrode 333. Alternatively, the third source electrode 332 may become a drain electrode, and the third drain electrode 333 may become a source electrode.

The third semiconductor pattern 331 may include a third channel region 331C, at which a channel may be formed during driving of the third thin film transistor 330, and a third source region 331S and a third drain region 331D respectively disposed at opposite sides of the third channel region 331C.

Referring to FIG. 2, the third semiconductor pattern 331 of the third thin film transistor 330 including an oxide semiconductor may be applied to a semiconductor pattern of a thin film transistor for gate signals in the display apparatus 200. The thin film transistor for gate signals may be a switching thin film transistor configured to perform a switching function.

The second gate insulating layer 213 may be formed on the second semiconductor pattern 321, the third semiconductor pattern 331 and the first gate insulating layer 212. The second gate insulating layer 213 may be constituted by a single layer made of silicon nitride ($SiN_x$) or silicon oxide ($SiO_x$) or multiple layers thereof.

The first gate electrode 354, the second gate electrode 324 and the third gate electrode 334 may be formed on the second gate insulating layer 213. The first gate electrode 354 disposed in the display area DA may overlap with the first channel region 351C of the first semiconductor pattern 351 under the condition that the first gate insulating layer 212 and the second gate insulating layer 213 are interposed between the first gate electrode 354 and the first channel region 351C. In addition, the second gate electrode 324 disposed in the display area DA may overlap with the second channel region 321C of the second semiconductor pattern 321 under the condition that the second gate insulating layer 213 is interposed between the second gate electrode 324 and the second channel region 321C. Furthermore, the third gate electrode 334 disposed in the non-display area NDA may overlap with the third channel region 331C of the third semiconductor pattern 331 under the condition that the second gate insulating layer 213 is interposed between the third gate electrode 334 and the third channel region 331C.

Thus, the gate insulating layer stacked between the first gate electrode 354 and the first semiconductor pattern 351 in the first thin film transistor 350 disposed in the display area DA may be constituted by a stacked structure of the first gate insulating layer 212 and the second gate insulating layer 213. Furthermore, the gate insulating layer stacked between the second gate electrode 324 and the second semiconductor pattern 321 in the second thin film transistor 320 disposed in the display area DA may be constituted by the second gate insulating layer 213. In addition, the gate insulating layer stacked between the third gate electrode 334 and the third semiconductor pattern 331 in the third thin film transistor 330 disposed in the non-display area NDA may also be constituted by the second gate insulating layer 213.

As such, the thickness of the gate insulating layer disposed between the first semiconductor pattern 351 and the first gate electrode 354 may be greater than the thickness of the gate insulating layer disposed between the second semiconductor pattern 321 and the third semiconductor pattern 331 and between the second gate electrode 324 and the third gate electrode 334. As the thickness of a gate insulating layer increases, leakage of current may be reduced. Accordingly, a thin film transistor including a thick gate insulating layer may be used as a driving thin film transistor for controlling an amount of current. Since a switching thin film transistor performs a switching function for controlling turn-on or turn-off, leakage of current therein may not cause a significant problem. In this regard, the thickness of a gate insulating layer in a thin film transistor performing a switching function may be smaller than the thickness of a gate insulating layer in a thin film transistor used as a driving thin film transistor.

As apparent from the above description, when the gate insulating layer of a thin film transistor is formed to have a large thickness, there may be an advantage in that leakage of current is reduced and, as such, an amount of current may be effectively controlled. However, when the thickness of the gate insulating layer of the thin film transistor increases, characteristics of a switching function may be degraded due to a decrease in mobility. On the other hand, when the gate insulating layer of the thin film transistor has a relatively small thickness, there may an advantage in that characteristics of a switching function may be enhanced due to an increase in mobility. However, as the thickness of the gate insulating layer decreases, current leakage increases, thereby causing characteristics of a current amount control function to be degraded. Therefore, in the display apparatus 200 according to the exemplary embodiment of the present disclosure, the thickness of the gate insulating layer may be designed to be varied in accordance with characteristics of the thin film transistor. Accordingly, the display apparatus 200 may include thin film transistors having different mobilities.

Referring to FIG. 2, the first thin film transistor 350 used as a driving thin film transistor may include a gate insulating layer that is thicker than the third thin film transistor 330 performing a switching function as a thin film transistor for gate signals. In addition, among the thin film transistors disposed in the display area DA, the first thin film transistor 350 used as a driving thin film transistor configured to supply current to the light emitting element 400 may include a gate insulating layer thicker than the second thin film transistor 320 used as a switching thin film transistor.

Accordingly, the thickness of the gate insulating layer disposed between the first semiconductor pattern 351 and the first gate electrode 354 may be greater than the thickness of the gate insulating layer disposed between the third semiconductor pattern 331 and the third gate electrode 334. In addition, the thickness of the gate insulating layer disposed between the first semiconductor pattern 351 and the first gate electrode 354 may be greater than the thickness of the gate insulating layer disposed between the second semiconductor pattern 321 and the second gate electrode 324. For example, as illustrated in FIG. 2, the gate insulating layer stacked between the first semiconductor pattern 351 and the first gate electrode 354 in the first thin film transistor 350 may be constituted by a stacked structure of the first gate insulating layer 212 and the third gate insulating layer 213 In addition, the gate insulating layer stacked between the third gate electrode 334 and the third semiconductor pattern 331 in the third thin film transistor 330 may be constituted by the second gate insulating layer 213. Furthermore, the gate insulating layer stacked between the second gate electrode 324 and the second semiconductor pattern 321 in the second thin film transistor 320 may be constituted by the second gate insulating layer 213.

The first gate electrode 354, the second gate electrode 324, and the third gate electrode 334 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof. The first gate electrode 354, the second gate electrode 324 and the third gate electrode 334 may be made of the same material, and may be disposed on the same layer.

The interlayer insulating layer 214 may be formed on the first gate electrode 354, the second gate electrode 324, the third gate electrode 334 and the second gate insulating layer 213.

The interlayer insulating layer 214 may be constituted by a single layer made of silicon nitride ($SiN_x$) or silicon oxide ($SiO_x$) or multiple layers thereof.

A contact hole may be formed to expose the first semiconductor pattern 351 of the first thin film transistor 350 by etching the second gate insulating layer 213 and the first gate insulating layer 212.

In addition, contact holes may be formed to expose the second semiconductor pattern 321 of the second thin film transistor 320 and the third semiconductor pattern 331 of the third thin film transistor 330 by etching the interlayer insulating layer 214 and the second gate insulating layer 213.

On the interlayer insulating layer 214, the first source electrode 352 and the first drain electrode 353 of the first thin film transistor 350, the second source electrode 322 and the second drain electrode 323 of the second thin film transistor 320, and the third source electrode 332 and the third drain electrode 333 of the third thin film transistor 330 may be disposed.

The first source electrode 352 and the first drain electrode 353 of the first thin film transistor 350 may be connected to the first source region 351S and the first drain region 351D of the first semiconductor pattern 351 via the contact holes formed through the interlayer insulating layer 214, the second gate insulating layer 213, and the first gate insulating layer 212, respectively.

In addition, the second source electrode 322 and the second drain electrode 323 of the second thin film transistor 320 may be connected to the second source region 321S and the second drain region 321D of the second semiconductor pattern 321 via the contact holes formed through the interlayer insulating layer 214 and the second gate insulating layer 213, respectively.

Furthermore, the third source electrode 332 and the third drain electrode 333 of the third thin film transistor 330 may be connected to the third source region 331S and the third drain region 331D of the third semiconductor pattern 331 via the contact holes formed through the interlayer insulating layer 214 and the second gate insulating layer 213, respectively.

The first source electrode 352 and the first drain electrode 353 of the first thin film transistor 350, the second source electrode 322 and the second drain electrode 323 of the second thin film transistor 320, and the third source electrode 332 and the third drain electrode 333 of the third thin film transistor 330 may be disposed to contact an upper surface of the interlayer insulating layer 214, and may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof.

The passivation layer 215 may be formed on the first source electrode 352 and the first drain electrode 353 of the first thin film transistor 350, the second source electrode 322 and the second drain electrode 323 of the second thin film transistor 320, and the third source electrode 332 and the third drain electrode 333 of the third thin film transistor 330.

A contact hole may be formed through the passivation layer 215 to expose the first drain electrode 353 of the first thin film transistor 350. However, the present disclosure is not limited to the above-described condition. A contact hole may be formed through the passivation layer 215 to expose the first source electrode 352 of the first thin film transistor 350. The passivation layer 215 may be a single layer or multiple layers made of an organic material. For example, the passivation layer 215 may be a single layer or multiple layers made of an organic material such as acryl resin, epoxy resin, phenolic resin, polyamide resin, or polyimide resin. Alternatively, the passivation layer 215 may be constituted by a single layer made of an inorganic material such as silicon nitride ($SiN_x$) or silicon oxide ($SiO_x$) or multiple layers thereof. Otherwise, the passivation layer 215 may be multiple layers constituted by an inorganic material layer and an organic material layer.

The first electrode 410 of the light emitting element 400 may be disposed on the passivation layer 215. The first electrode 410 may be electrically connected to the first thin film transistor 350 via the contact hole formed through the passivation layer 215. The first electrode 410 may be formed to have a multilayer structure including a transparent conductive film and an opaque conductive film having high reflection efficiency. The transparent conductive film may be made of a material having a relatively great work function value such as indium tin oxide (ITO) or indium zinc oxide (IZO). The opaque conductive film may be formed by a single layer or multiple layers including aluminum (Al), silver (Ag), copper (Cu), lead (Pb), molybdenum (Mo), titanium (Ti) or an alloy thereof. For example, the first electrode 410 may be formed through sequential formation of a transparent conductive film, an opaque conductive film and a transparent conductive film. Of course, the present disclosure is not limited to the above-described condition. For example, a transparent conductive film and an opaque conductive film may be sequentially formed.

The display apparatus according to the exemplary embodiment of the present disclosure is a top emission display apparatus and, as such, the first electrode 410 may be an anode. When the display apparatus is of a bottom emission type, the first electrode 410 disposed on the passivation layer 215 may be a cathode.

The bank layer 216 may be disposed on the first electrode 410 and the passivation layer 215. An opening may be formed through the bank layer 216 to expose the first electrode 410. The bank layer 216 may define a light emission area of the display apparatus and, as such, may be referred to as a "pixel definition film". The spacer 217 may further be disposed on the bank layer 216. In addition, a light emitting layer 420 of the light emitting element 400 may further be disposed on the first electrode 410.

The light emitting layer 420 may be formed on the first electrode 410 in an order of a hole layer HL, an emission material layer EML, and an electron layer EL or a reversed order thereof.

Alternatively, the light emitting layer 420 may include a first light emitting layer and a second light emitting layer under the condition that a charge generation layer CGL is interposed between the first light emitting layer and the second light emitting layer. In this case, one emission material layer of the first and second light emitting layers may generate blue light, and the other emission material layer of the first and second light emitting layers may generate yellow-green light and, as such, white light may be generated through the first and second light emitting layers. The white light generated through the first and second light emitting layers may be incident upon a color filter disposed above the light emitting layers and, as such, a color image may be realized. Alternatively, a color image may be realized as each light emitting layer generates colored light corresponding to each sub-pixel without use of a separate color filter. That is, the light emitting layer of a red (R) sub-pixel may generate red light, the light emitting layer of a green (G) sub-pixel may generate green light, and the light emitting layer of a blue (B) sub-pixel may generate blue light.

Referring to FIG. 2, a second electrode 430 of the light emitting element 400 may further be disposed on the light emitting layer 420. The second electrode 430 may overlap with the first electrode 410 under the condition that the light emitting layer 420 is interposed between the second electrode 430 and the first electrode 410. In the display apparatus according to the exemplary embodiment of the present disclosure, the second electrode 430 may be a cathode.

The encapsulator 500 may be disposed on the second electrode 430 to suppress penetration of moisture. The encapsulator 500 may include a first encapsulation layer 510, a second encapsulation layer 520, and a third encapsulation layer 530. The second encapsulation layer 520 may include a material different from those of the first and third encapsulation layers 510 and 530. For example, each of the first encapsulation layer 510 and the third encapsulation layer 530 may be an inorganic insulating film made of an inorganic insulating material, whereas the second encapsulation layer 520 may be an organic insulating film made of an organic insulating material. The first encapsulation layer 510 of the encapsulator 500 may be disposed on the second electrode 430. The second encapsulation layer 520 may be disposed on the first encapsulation layer 510. In addition, the third encapsulation layer 530 may be disposed on the second encapsulation layer 520.

The first and third encapsulation layers 510 and 530 of the encapsulator 500 may be made of an inorganic material such as silicon nitride ($SiN_x$) or silicon oxide ($SiO_x$). The second encapsulation layer 520 of the encapsulator 500 may be made of an organic material such as acryl resin, epoxy resin, phenolic resin, polyamide resin, or polyimide resin.

Figure 3:
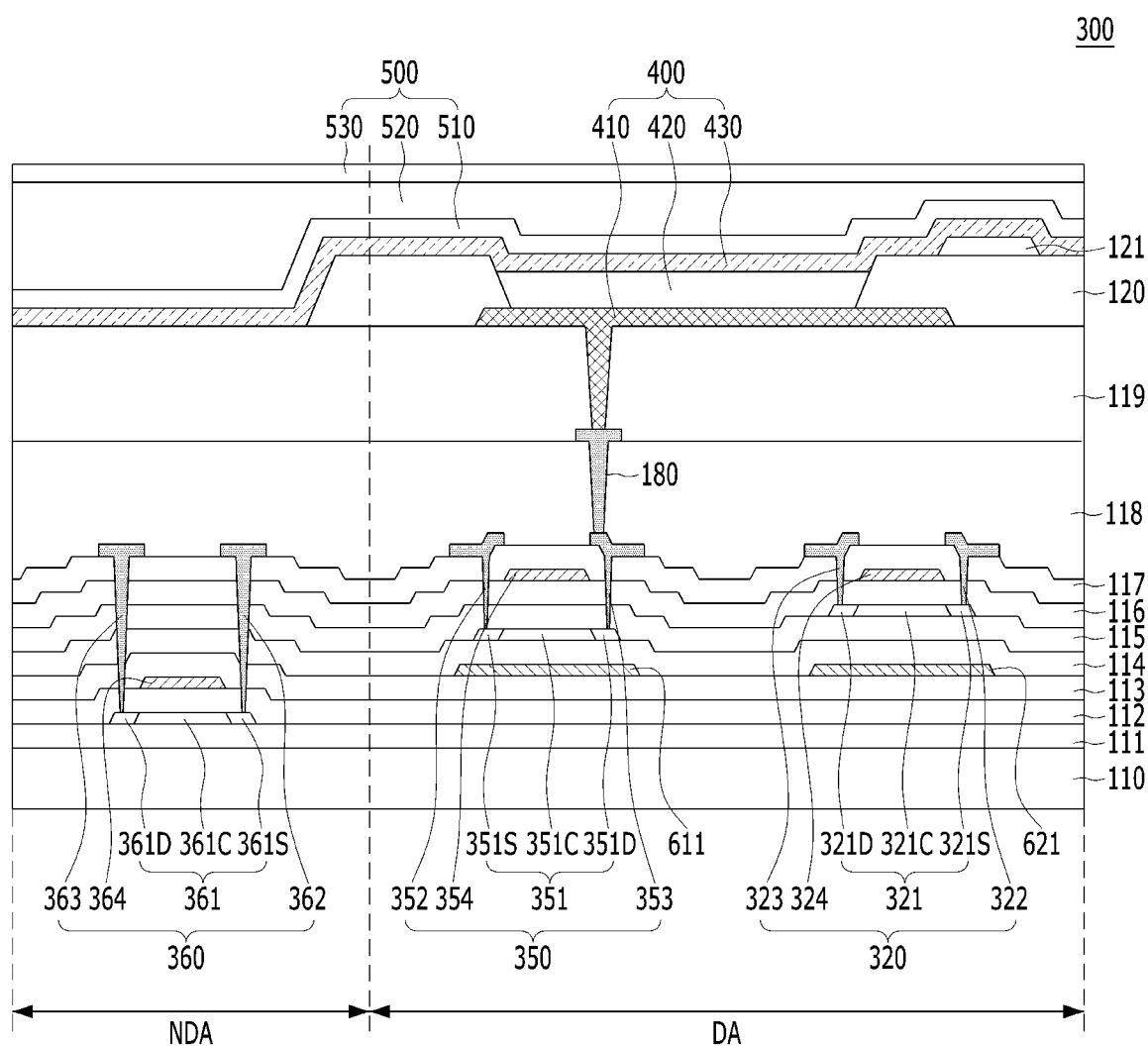
FIG. 3 is a sectional view of a display apparatus according to another exemplary embodiment of the present disclosure.

FIG. 3 is a sectional view of a display apparatus according to another exemplary embodiment of the present disclosure.

Referring to FIG. 3, the display area DA of a substrate 310 in a display apparatus 300 may be constituted by a plurality of pixels. Each pixel may be constituted by a first thin film transistor 350 and a second thin film transistor 320. Each of the first and second thin film transistors 350 and 320 may include an oxide semiconductor material. Of course, the present disclosure is not limited to the above-described condition, and each pixel may further include a thin film transistor including a polysilicon material, as in the case of FIG. 1. The following description associated with FIG. 3 will be given mainly in conjunction with the second thin film transistor 320, which is a switching thin film transistor, and the first thin film transistor 350, which is a driving thin film transistor, among thin film transistors made of an oxide semiconductor.

A non-display area NDA may be disposed adjacent to the display area DA in the substrate 310. A driving circuit configured to drive the pixels of the display area DA may be disposed in the non-display area NDA. The driving circuit may include a third thin film transistor 360. The third thin film transistor 360 disposed in the non-display area NDA may include polysilicon.

Each of the first thin film transistor 350 and the second thin film transistor 320 disposed in the display area DA may be constituted by a negative type thin film transistor (n-type TFT). In addition, the third thin film transistor 360 disposed in the non-display area NDA may be constituted by a negative type thin film transistor (n-type TFT). Alternatively, each of the first thin film transistor 350 and the second thin film transistor 320 disposed in the display area DA may be constituted by a positive type thin film transistor (p-type TFT). In addition, the third thin film transistor 360 disposed in the non-display area NDA may be constituted by a negative type thin film transistor (n-type TFT).

Referring to FIG. 3, the display apparatus 300 according to another exemplary embodiment of the present disclosure may include the substrate 110, a buffer layer 111, a first gate insulating layer 112, a first interlayer insulating layer 113, a second buffer layer 114, a second gate insulating layer 115, a third gate insulating layer 116, a second interlayer insulating layer 117, a passivation layer 118, a second passivation layer 119, a bank layer 120, a spacer 121, a first metal pattern 611, a second metal pattern 612, an auxiliary electrode 180, a light emitting element 400, an encapsulator 500, the first thin film transistor 350, the second thin film transistor 320, and the third thin film transistor 360.

The substrate 110 may support various constituent elements of the display apparatus 300. The substrate 110 may be made of glass or a plastic material having flexibility. For example, when the substrate 110 is made of a plastic material, the substrate 110 may be made of polyimide (PI).

When the substrate 110 may be made of polyimide (PI), moisture components may penetrate up to the first thin film transistor 350 or the light emitting element 400 after emerging from the substrate 110 made of polyimide (PI) and, as such, may degrade performance of the display apparatus. In order to avoid performance degradation caused by penetration of moisture in the display apparatus 300 according to the exemplary embodiment of the present disclosure, the substrate 110 may be constituted by double polyimide (PI). In this case, an inorganic insulating layer is formed between two polyimide (PI) layers and, as such, it may be possible to reduce the passing of moisture components through the lower polyimide (PI) layer, thereby achieving an enhancement in reliability of the display apparatus.

The first buffer layer 111 may be formed over the entire surface of the substrate 110. The first buffer layer 111 may be constituted by a single layer made of silicon nitride ($SiN_x$) or silicon oxide ($SiO_x$) or multiple layers thereof. In an exemplary embodiment of the present disclosure, the first buffer layer 111 may have a multilayer structure in which silicon nitride ($SiN_x$) layers and silicon oxide ($SiO_x$) layers are alternately formed. When the first buffer layer 111 has a multilayer structure in which silicon nitride ($SiN_x$) layers and silicon oxide ($SiO_x$) layers are alternately formed, as described above, uppermost and lowermost layers of the first buffer layer 111 may be made of silicon oxide ($SiO_x$).

The third thin film transistor 360 disposed in the non-display area NDA may be disposed on the first buffer layer 111. The third thin film transistor 360 disposed in the non-display area NDA may include a third semiconductor pattern 361, a third gate electrode 364, a third source electrode 362, and a third drain electrode 363. Of course, the present disclosure is not limited to the above-described conditions. The third source electrode 362 may become a drain electrode, and the third drain electrode 363 may become a source electrode.

The third semiconductor pattern 361 of the third thin film transistor 360 may be disposed on the first buffer layer 111. The third semiconductor pattern 361 may be disposed in the non-display area NDA. The third semiconductor pattern 361 may include polysilicon (poly-Si). For example, the third thin film transistor 361 may include low temperature polysilicon (LTPS). In accordance with the exemplary embodiment of the present disclosure, the third semiconductor pattern 361 of the third thin film transistor 360 in the non-display area NDA may be applied to a semiconductor pattern of a thin film transistor for gate signals. The thin film transistor for gate signals may be a switching thin film transistor configured to perform a switching function.

The third semiconductor pattern 361 formed in the non-display area NDA may include a third channel region 361C, at which a channel may be formed during driving of the third thin film transistor 360, and a third source region 361S and a third drain region 361D respectively disposed at opposite sides of the third channel region 361C.

The first gate insulating layer 112 may be disposed on the third semiconductor pattern 361 of the third thin film transistor 360. The first gate insulating layer 112 may be constituted by a single layer made of silicon nitride ($SiN_x$) or silicon oxide ($SiO_x$) or multiple layers thereof.

The third gate electrode 364 of the third thin film transistor 360 may be disposed on the first gate insulating layer 112.

The third gate electrode 364 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof. The third gate electrode 334 may be made of the same material as the second gate electrode 324, and may be disposed on the same layer together with the second gate electrode 324.

The third gate electrode 364 is disposed in the non-display area NDA while overlapping with the third channel region 361C of the third semiconductor pattern 361 under the condition that the first gate insulating layer 112 is interposed between the third gate electrode 364 and the third channel region 361C.

The first interlayer insulating layer 113 may be disposed on the first gate insulating layer 112 and the third gate electrode 364. The first interlayer insulating layer 113 may be constituted by a single layer made of silicon nitride ($SiN_x$) or silicon oxide ($SiO_x$) or multiple layers thereof.

In addition, the first metal pattern 611 and the second metal pattern 621 may be disposed on the first interlayer insulating layer 113 in the display area DA. Furthermore, the first metal pattern 611 may overlap with the first semiconductor pattern 351 of the first thin film transistor 350, and the second metal pattern 621 may overlap with the second semiconductor pattern 321 of the second thin film transistor 320.

The first metal pattern 611 and the second metal pattern 621 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof. The first metal pattern 611 and the second metal pattern 621 may be made of the same material, and may be formed on the same layer. The first metal pattern 611 and the second metal pattern 621 may have a light shield function for shielding external light incident upon the first semiconductor pattern 351 and the second semiconductor pattern 321 after passing through the substrate.

The second buffer layer 114 may be disposed on the first interlayer insulating layer 113, the first metal pattern 611 and the second metal pattern 621. The second buffer layer 114 may be constituted by a single layer made of silicon nitride ($SiN_x$) or silicon oxide ($SiO_x$) or multiple layers thereof.

The first semiconductor pattern 351 of the first thin film transistor 350 may be formed on the second buffer layer 114. The first semiconductor pattern 351 may be disposed in the display area DA while overlapping with the first metal pattern 611. The first semiconductor pattern 351 may be an oxide semiconductor pattern made of an oxide semiconductor. The first thin film transistor 350 may include a first semiconductor pattern 351, a first gate electrode 354, a first source electrode 352, and a first drain electrode 353. Alternatively, the first source electrode 352 may become a drain electrode, and the first drain electrode 353 may become a source electrode.

The first semiconductor pattern 351 may include a first channel region 351C, at which a channel may be formed during driving of the first thin film transistor 350, and a first source region 351S and a first drain region 351D respectively disposed at opposite sides of the first channel region 351C.

Referring to FIG. 3, the first thin film transistor 350 including an oxide semiconductor may be a driving thin film transistor configured to supply current to the light emitting element 400.

The second gate insulating layer 115 may be formed on the first semiconductor pattern 351 and the second buffer layer 114. The second gate insulating layer 1154 may be constituted by a single layer made of silicon nitride ($SiN_x$) or silicon oxide ($SiO_x$) or multiple layers thereof.

The second semiconductor pattern 321 of the second thin film transistor 320 may be disposed on the second gate insulating layer 115. The second semiconductor pattern 321 may be disposed in the display area DA while overlapping with the second metal pattern 621. The second semiconductor pattern 321 may be an oxide semiconductor pattern made of an oxide semiconductor. The second thin film transistor 320 may include a second semiconductor pattern 321, a second gate electrode 324, a second source electrode 322, and a second drain electrode 323. Alternatively, the second source electrode 322 may become a drain electrode, and the second drain electrode 323 may become a source electrode.

The second semiconductor pattern 321 may include a second channel region 321C, at which a channel may be formed during driving of the second thin film transistor 320, and a second source region 321S and a second drain region 321D respectively disposed at opposite sides of the second channel region 321C. Referring to FIG. 3, the second thin film transistor 320 including an oxide semiconductor may be a switching thin film transistor.

The third gate insulating layer 116 may be formed on the second semiconductor pattern 321 and the second gate insulating layer 115. The third gate insulating layer 116 may be constituted by a single layer made of silicon nitride ($SiN_x$) or silicon oxide ($SiO_x$) or multiple layers thereof.

The first gate electrode 354 and the second gate electrode 324 may be formed on the third gate insulating layer 116. The first gate electrode 354 disposed in the display area DA may overlap with the first channel region 351C of the first semiconductor pattern 351 under the condition that the second gate insulating layer 115 and the third gate insulating layer 116 are interposed between the first gate electrode 354 and the first channel region 351C. In addition, the second gate electrode 324 disposed in the display area DA may overlap with the second channel region 321C of the second semiconductor pattern 321 under the condition that the third gate insulating layer 116 is interposed between the second gate electrode 324 and the second channel region 321C.

Thus, the gate insulating layer stacked between the first gate electrode 354 and the first semiconductor pattern 351 in the first thin film transistor 350 disposed in the display area DA may be constituted by a stacked structure of the second gate insulating layer 115 and the third gate insulating layer 116. In addition, the gate insulating layer stacked between the second gate electrode 324 and the second semiconductor pattern 321 in the second thin film transistor 320 disposed in the display area DA may be constituted by the third gate insulating layer 116.

As such, the thickness of the gate insulating layer disposed between the first semiconductor pattern 351 and the first gate electrode 354 may be greater than the thickness of the gate insulating layer disposed between the second semiconductor pattern 321 and the second gate electrode 324. As the thickness of a gate insulating layer increases, leakage of current may be reduced. Accordingly, a thin film transistor including a thick gate insulating layer may be used as a driving thin film transistor for controlling an amount of current. Since a switching thin film transistor performs a switching function for controlling turn-on or turn-off, leakage of current therein may not cause a significant problem. In this regard, the thickness of a gate insulating layer in a thin film transistor performing a switching function may be smaller than the thickness of a gate insulating layer in a thin film transistor used as a driving thin film transistor.

As apparent from the above description, when the gate insulating layer of a thin film transistor is formed to have a large thickness, there may be an advantage in that leakage of current is reduced and, as such, an amount of current may be effectively controlled. However, when the thickness of the gate insulating layer of the thin film transistor increases, characteristics of a switching function may be degraded due to a decrease in mobility. On the other hand, when the gate insulating layer of the thin film transistor has a relatively small thickness, there may be an advantage in that characteristics of a switching function may be enhanced due to an increase in mobility. However, as the thickness of the gate insulating layer decreases, current leakage increases, thereby causing characteristics of a current amount control function to be degraded. Therefore, in the display apparatus 300 according to the exemplary embodiment of the present disclosure, the thickness of the gate insulating layer may be designed to be varied in accordance with characteristics of the thin film transistor. Accordingly, the display apparatus 300 may include thin film transistors having different mobilities in accordance with different thicknesses of gate insulating layers.

Referring to FIG. 3, the first thin film transistor 350 used as a driving thin film transistor may include a gate insulating layer thicker than the second thin film transistor 320 used as a switching thin film transistor. Accordingly, among the thin film transistors disposed in the display area DA, the first thin film transistor 350 used as a driving thin film transistor configured to supply current to the light emitting device 400 may include a thicker gate insulating layer than the second thin film transistor 320 used as a switching thin film transistor.

The thickness of the gate insulating layer disposed between the first semiconductor pattern 351 and the first gate electrode 354 may be greater than the thickness of the gate insulating layer disposed between the second semiconductor pattern 321 and the second gate electrode 324. For example, as illustrated in FIG. 3, the gate insulating layer stacked between the first gate electrode 354 and the first semiconductor pattern 351 in the first thin film transistor 350 may have a stacked structure of the second gate insulating layer 115 and the third gate insulating layer 116. In addition, the gate insulating layer stacked between the second gate electrode 324 and the second semiconductor pattern 321 in the second thin film transistor 320 may be constituted by the third gate insulating layer 116.

Each of the first gate electrode 354 and the second gate electrode 324 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof. In addition, the first gate electrode 354 and the second gate electrode 324 may be made of the same material, and may be disposed on the same layer.

The second interlayer insulating layer 117 may be formed on the first gate electrode 354, the second gate electrode 324, and the third gate insulating layer 116. The second interlayer insulating layer 117 may be constituted by a single layer made of silicon nitride ($SiN_x$) or silicon oxide ($SiO_x$) or multiple layers thereof.

Contact holes may be formed to expose the third semiconductor pattern 361 of the third thin film transistor 360 by etching the second interlayer insulating layer 117, the third gate insulating layer 116, the second gate insulating layer 115, the second buffer layer 114, the first interlayer insulating layer 113 and the first gate insulating layer 112. Accordingly, contact holes may be formed to expose the third source region 361S and the third drain region 361D in the third semiconductor pattern 361, respectively.

In addition, contact holes may be formed to expose the first semiconductor pattern 351 of the first thin film transistor 350 by etching the second interlayer insulating layer 117, the third gate insulating layer 116 and the second gate insulating layer 115. Accordingly, contact holes may be formed to expose the first source region 351S and the first drain region 351D in the first semiconductor pattern 351, respectively.

Furthermore, contact holes may be formed to expose the second semiconductor pattern 321 of the second thin film transistor 320 by etching the second interlayer insulating layer 117 and the third gate insulating layer 116. Accordingly, contact holes may be formed to expose the second source region 321S and the second drain region 321D in the second semiconductor pattern 321, respectively.

On the second interlayer insulating layer 117, the first source electrode 352 and the first drain electrode 353 of the first thin film transistor 350, the second source electrode 322 and the second drain electrode 323 of the second thin film transistor 320, and the third source electrode 362 and the third drain electrode 363 of the third thin film transistor 360 may be disposed.

The first source electrode 352 and the first drain electrode 353 of the first thin film transistor 350 may be connected to the first source region 351S and the first drain region 351D of the first semiconductor pattern 351 via the contact holes formed through the second interlayer insulating layer 117, the third gate insulating layer 116 and the second gate insulating layer 115, respectively.

In addition, the second source electrode 322 and the second drain electrode 323 of the second thin film transistor 320 may be connected to the second source region 321S and the second drain region 321D of the second semiconductor pattern 321 via the contact holes formed through the second interlayer insulating layer 117 and the third gate insulating layer 116, respectively.

Furthermore, the third source electrode 362 and the third drain electrode 363 of the third thin film transistor 360 may be connected to the third source region 361S and the third drain region 361D of the third semiconductor pattern 361 via the contact holes formed through the second interlayer insulating layer 117, the third gate insulating layer 116, the second gate insulating layer 115, the second buffer layer 114, the first interlayer insulating layer 113 and the first gate insulating layer 112, respectively.

The first source electrode 352 and the first drain electrode 353 of the first thin film transistor 350, the second source electrode 322 and the second drain electrode 323 of the second thin film transistor 320, and the third source electrode 362 and the third drain electrode 363 of the third thin film transistor 360 may be made of the same material, and may be disposed on the same layer. In addition, these elements may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof.

The first passivation layer 118 may be formed on the first source electrode 352 and the first drain electrode 353 of the first thin film transistor 350, the second source electrode 322 and the second drain electrode 323 of the second thin film transistor 320, and the third source electrode 362 and the third drain electrode 363 of the third thin film transistor 360.

A contact hole may be formed through the first passivation layer 118 to expose the first drain electrode 353 of the first thin film transistor 350. However, the present disclosure is not limited to the above-described condition. A contact hole may be formed through the first passivation layer 118 to expose the first source electrode 352 of the first thin film transistor 350. The first passivation layer 118 may be an organic material layer. For example, the first passivation layer 118 may be made of an organic material such as acryl resin, epoxy resin, phenolic resin, polyamide resin, or polyimide resin. Alternatively, the first passivation layer 118 may be constituted by a single layer made of silicon nitride ($SiN_x$) or silicon oxide ($SiO_x$) or multiple layers thereof.

The auxiliary electrode 180 may be disposed on the first passivation layer 118. In addition, the auxiliary electrode 180 may be connected to the first drain electrode 353 of the first thin film transistor 350 via the contact hole of the first passivation layer 118. The auxiliary electrode 180 may electrically connect the first thin film transistor 350 and the first electrode 410 of the light emitting element 400. The auxiliary electrode 180 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof. The auxiliary electrode 180 may be made of the same material as the first source electrode 352 and the first drain electrode 353 of the first thin film transistor 350.

The second passivation layer 119 may be disposed on the auxiliary electrode 180 and the first passivation layer 118. In addition, as illustrated in FIG. 3, a contact hole may be formed through the second passivation layer 119 to expose the auxiliary electrode 180. The second passivation layer 119 may be an organic material layer. For example, the second passivation layer 119 may be made of an organic material such as acryl resin, epoxy resin, phenolic resin, polyamide resin, or polyimide resin.

The first electrode 410 of the light emitting element 400 may be disposed on the second passivation layer 119. The first electrode 410 may be electrically connected to the auxiliary electrode 180 via the contact hole formed through the second passivation layer 119. Accordingly, the first electrode 410 may be electrically connected to the first thin film transistor 350 in accordance with connection thereof to the auxiliary electrode 180 via the contact hole formed through the second passivation layer 119.

The first electrode 410 may be formed to have a multi-layer structure including a transparent conductive film and an opaque conductive film having high reflection efficiency. The transparent conductive film may be made of a material having a relatively great work function value such as indium tin oxide (ITO) or indium zinc oxide (IZO). The opaque conductive film may be formed by a single layer or multiple layers including aluminum (Al), silver (Ag), copper (Cu), lead (Pb), molybdenum (Mo), titanium (Ti) or an alloy thereof. For example, the first electrode 410 may be formed through sequential formation of a transparent conductive film, an opaque conductive film and a transparent conductive film. Of course, the present disclosure is not limited to the above-described condition. For example, a transparent conductive film and an opaque conductive film may be sequentially formed.

The display apparatus according to the exemplary embodiment of the present disclosure is a top emission display apparatus and, as such, the first electrode 410 may be an anode. When the display apparatus is of a bottom emission type, the first electrode 410 disposed on the second passivation layer 119 may be a cathode.

The bank layer 120 may be disposed on the first electrode 410 and the second passivation layer 119. An opening may be formed through the bank layer 120 to expose the first electrode 410. The bank layer 120 may define a light emission area of the display apparatus and, as such, may be referred to as a "pixel definition film". The spacer 121 may further be disposed on the bank layer 120. In addition, a light emitting layer 420 of the light emitting element 400 may further be disposed on the first electrode 410.

The light emitting layer 420 may be formed on the first electrode 410 in an order of a hole layer HL, an emission material layer EML, and an electron layer EL or a reversed order thereof.

Alternatively, the light emitting layer 420 may include a first light emitting layer and a second light emitting layer under the condition that a charge generation layer CGL is interposed between the first light emitting layer and the second light emitting layer. In this case, one emission material layer of the first and second light emitting layers may generate blue light, and the other emission material layer of the first and second light emitting layers may generate yellow-green light and, as such, white light may be generated through the first and second light emitting layers. The white light generated through the first and second light emitting layers may be incident upon a color filter disposed above the light emitting layers and, as such, a color image may be realized. Alternatively, a color image may be realized as each light emitting layer generates colored light corresponding to each sub-pixel without use of a separate color filter. That is, the light emitting layer of a red (R) sub-pixel may generate red light, the light emitting layer of a green (G) sub-pixel may generate green light, and the light emitting layer of a blue (B) sub-pixel may generate blue light.

Referring to FIG. 3, a second electrode 430 of the light emitting element 400 may further be disposed on the light emitting layer 420. The second electrode 430 may overlap with the first electrode 410 under the condition that the light emitting layer 420 is interposed between the second electrode 430 and the first electrode 410. In the display apparatus according to the exemplary embodiment of the present disclosure, the second electrode 430 may be a cathode.

The encapsulator 500 may be disposed on the second electrode 430 to suppress penetration of moisture. The encapsulator 500 may include a first encapsulation layer 510, a second encapsulation layer 520, and a third encapsulation layer 530. The second encapsulation layer 520 may include a material different from those of the first and third encapsulation layers 510 and 530. For example, each of the first encapsulation layer 510 and the third encapsulation layer 530 may be an inorganic insulating film made of an inorganic insulating material, whereas the second encapsulation layer 520 may be an organic insulating film made of an organic insulating material. The first encapsulation layer 510 of the encapsulator 500 may be disposed on the second electrode 430. The second encapsulation layer 520 may be disposed on the first encapsulation layer 510. In addition, the third encapsulation layer 530 may be disposed on the second encapsulation layer 520.

The first and third encapsulation layers 510 and 530 of the encapsulator 500 may be made of an inorganic material such as silicon nitride ($SiN_x$) or silicon oxide ($SiO_x$). The second encapsulation layer 520 of the encapsulator 500 may be made of an organic material such as acryl resin, epoxy resin, phenolic resin, polyamide resin, or polyimide resin.

Figure 4:
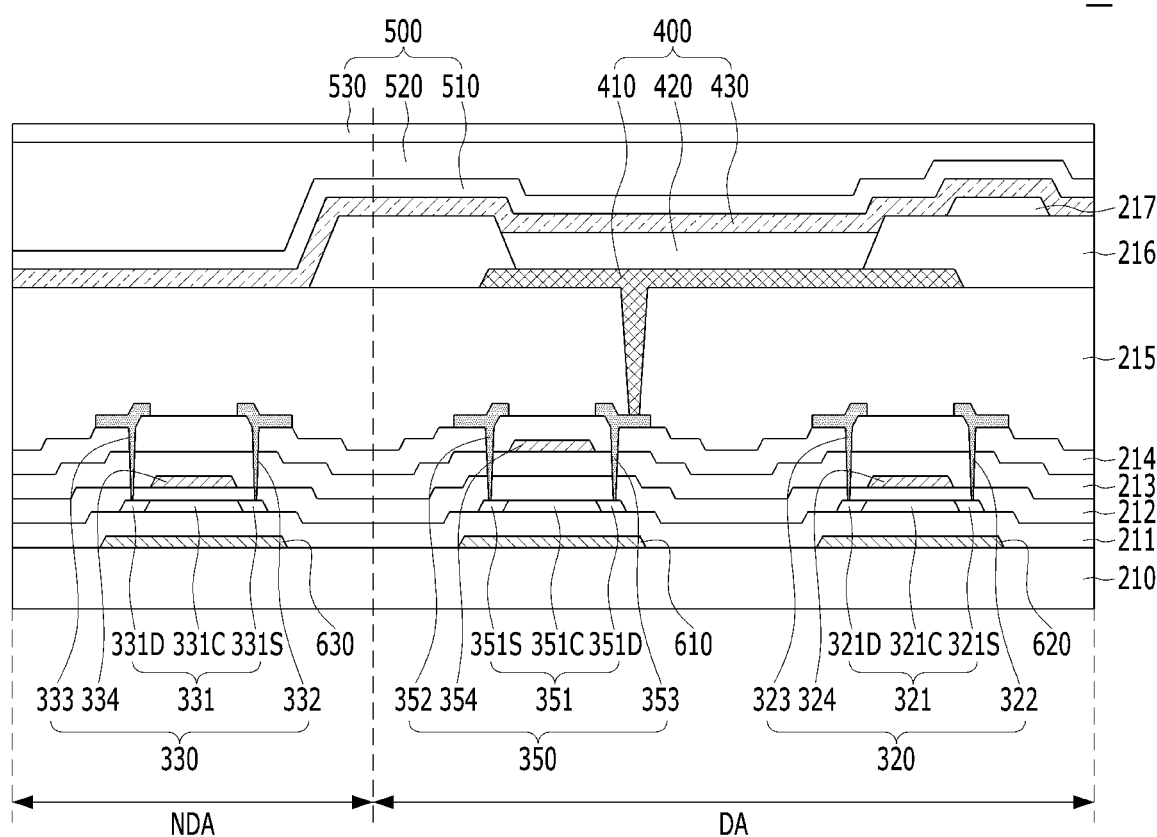
FIG. 4 is a sectional view of a display apparatus according to another exemplary embodiment of the present disclosure.

FIG. 4 is a sectional view of a display apparatus according to another exemplary embodiment of the present disclosure. Description of FIG. 4 will be given with reference to description of FIG. 2, and overlapping description will be omitted or briefly given. For example, a substrate 210, a buffer layer 211, a first gate insulating layer 212, a second gate insulating layer 213, an interlayer insulating layer 214, a passivation layer 215, a bank layer 216, a spacer 217, a first metal pattern 610, a second metal pattern 620, a third metal pattern 630, a light emitting element 400, an encapsulator 500, and a first thin film transistor 350 in FIG. 4 are substantially identical to those of FIG. 2. Accordingly, overlapping description of the configuration of FIG. 4 substantially identical to that of FIG. 2 may be omitted or briefly given.

Referring to FIG. 4, the display apparatus according to another embodiment of the present disclosure, which is designated by reference numeral "40", may include the substrate 210, the buffer layer 211, the first gate insulating layer 212, the second gate insulating layer 213, the interlayer insulating layer 214, the passivation layer 215, the bank layer 216, the spacer 217, the first metal pattern 610, the second metal pattern 620, the third metal pattern 630, the light emitting element 400, the encapsulator 500, the first thin film transistor 350, a second thin film transistor 320, and a third thin film transistor 330.

Referring to FIG. 4, the display area DA of the substrate 210 in the display apparatus 40 may be constituted by a plurality of pixels. Each pixel may be constituted by a first thin film transistor 350 and a second thin film transistor 320. Each of the first and second thin film transistors 350 and 320 may include an oxide semiconductor material. Of course, the present disclosure is not limited to the above-described condition, and each pixel may further include a thin film transistor including a polysilicon material, as in the case of FIG. 1. The following description associated with FIG. 4 will be given mainly in conjunction with the second thin film transistor 320, which is a switching thin film transistor, and the first thin film transistor 350, which is a driving thin film transistor, among thin film transistors made of an oxide semiconductor.

The non-display area NDA may be disposed adjacent to the display area DA in the substrate 210. A driving circuit configured to drive the pixels of the display area DA may be disposed in the non-display area NDA. The driving circuit may include a third thin film transistor 330. The third thin film transistor 330 disposed in the non-display area NDA may include oxide semiconductor.

The first thin film transistor 350 and the second thin film transistor 320 disposed in the display area DA may be constituted by a negative type thin film transistor (n-type TFT). In addition, the third thin film transistor 330 disposed in the non-display area NDA may be constituted by a negative type thin film transistor (n-type TFT).

The substrate 210 may support various constituent elements of the display apparatus 40. The substrate 210 may be made of glass or a plastic material having flexibility. For example, when the substrate 210 is made of a plastic material, the substrate 210 may be made of polyimide (PI).

In order to avoid performance degradation caused by penetration of moisture in the display apparatus 40 according to the exemplary embodiment of the present disclosure, the first metal pattern 610, the second metal pattern 620 and the third metal pattern 630 may be formed on the substrate 210.

In addition, the first metal pattern 610, the second metal pattern 620 and the third metal pattern 630 may have a light shield function for reducing external light from being incident upon semiconductor patterns of the first thin film transistor 350, the second thin film transistor 320 and the third thin film transistor 330.

The first metal pattern 610 may overlap with a first semiconductor pattern 351 of the first thin film transistor 350. In addition, the second metal pattern 620 may overlap with a second semiconductor pattern 321 of the second thin film transistor 320. Furthermore, the third metal pattern 630 may overlap with a third semiconductor pattern 331 of the third thin film transistor 330.

The buffer layer 211 may be formed on the first metal pattern 610, the second metal pattern 620 and the third metal pattern 630. The buffer layer 211 may be constituted by a single layer made of silicon nitride ($SiN_x$) or silicon oxide ($SiO_x$) or multiple layers thereof. In an exemplary embodiment of the present disclosure, the buffer layer 211 may have a multilayer structure in which silicon nitride ($SiN_x$) layers and silicon oxide ($SiO_x$) layers are alternately formed.

When the buffer layer 211 has a multilayer structure in which silicon nitride ($SiN_x$) layers and silicon oxide ($SiO_x$) layers are alternately formed, as described above, uppermost and lowermost layers of the buffer layer 211 may be made of silicon oxide ($SiO_x$).

Although the first metal pattern 610, the second metal pattern 620, and the third metal pattern 630 are illustrated in FIG. 4 as being formed on the buffer layer 211, the present disclosure is not limited thereto. For example, when the buffer layer 211 has a multilayer structure, each of the first metal pattern 610, the second metal pattern 620, and the third metal pattern 630 may be disposed between adjacent ones of multiple layers in the buffer layer 211.

The first thin film transistor 350 may be disposed on the buffer layer 211. The first thin film transistor 350 may be disposed in the display area DA of the display apparatus 40.

The first thin film transistor 350 disposed in the display area DA may include the first semiconductor pattern 351, a first gate electrode 354, a first source electrode 352, and a first drain electrode 353.

The first semiconductor pattern 351 of the first thin film transistor 350, the second semiconductor pattern 321 of the second thin film transistor 320, and the third semiconductor pattern 331 of the third thin film transistor 330 may be formed on the buffer layer 211. The first semiconductor pattern 351 and the second semiconductor pattern 321 may be disposed in the display area DA, whereas the third semiconductor pattern 331 may be disposed in the non-display area NDA. In addition, the first semiconductor pattern 351 may be disposed to overlap with the first metal pattern 610, whereas the second semiconductor pattern 321 may overlap with the second metal pattern 620. In addition, the third semiconductor pattern 351 may overlap with the third metal pattern 630. Each of the first semiconductor pattern 351, the second semiconductor pattern 321 and the third semiconductor pattern 331 may be an oxide semiconductor pattern made of an oxide semiconductor.

The first thin film transistor 350 including an oxide semiconductor may be a driving thin film transistor configured to supply current to the light emitting element 400. The second thin film transistor including an oxide semiconductor may be a switching thin film transistor. The third thin film transistor 330 including an oxide semiconductor may be applied to a semiconductor pattern of a thin film transistor for gate signals. The thin film transistor for gate signals may be a switching thin film transistor configured to perform a switching function.

Referring to FIG. 4, the first semiconductor pattern 351, the second semiconductor pattern 321 and the third semiconductor pattern 331 may be disposed on the same layer.

The first gate insulating layer 212 may be formed on the first semiconductor pattern 351, the second semiconductor pattern 321, the third semiconductor pattern 331 and the buffer layer 211. The first gate insulating layer 212 may be constituted by a single layer made of silicon nitride ($SiN_x$) or silicon oxide ($SiO_x$) or multiple layers thereof.

In addition, the second gate electrode 324 and the third gate electrode 334 may be formed on the first gate insulating layer 212. The second gate electrode disposed in the display area DA may overlap with the second channel region 321C of the second semiconductor pattern 321 under the condition that the first gate insulating layer 212 is interposed between the second gate electrode 324 and the second channel region 321C. In addition, the third gate electrode 334 disposed in the non-display area NDA may overlap with the third channel region 331C of the third semiconductor pattern 331 under the condition that the first gate insulating layer 212 is interposed between the third gate electrode 334 and the third channel region 331C.

The gate insulating layer stacked between the second gate electrode 324 and the second semiconductor pattern 321 in the second thin film transistor 320 disposed in the display area DA may be constituted by the first gate insulating layer 212. Furthermore, the gate insulating layer stacked between the third gate electrode 334 and the third semiconductor pattern 331 in the third thin film transistor 330 disposed in the non-display area NDA may be constituted by the first gate insulating layer 212.

Referring to FIG. 4, the second gate insulating layer 213 may be formed on the second gate electrode 324, the third gate electrode 334 and the first gate insulating layer 212. The second gate insulating layer 213 may be constituted by a single layer made of silicon nitride ($SiN_x$) or silicon oxide ($SiO_x$) or multiple layers thereof.

The first gate electrode 354 may be formed on the second gate insulating layer 213. The first gate electrode 354 disposed in the display area DA may overlap with the first channel region 351C of the first semiconductor pattern 351 under the condition that the first gate insulating layer 212 and the second gate insulating layer 213 are interposed between the first gate electrode 354 and the first channel region 351C.

Thus, the gate insulating layer stacked between the first gate electrode 354 and the first semiconductor pattern 351 in the first thin film transistor 350 disposed in the display area DA may be constituted by a stacked structure of the first gate insulating layer 212 and the second gate insulating layer 213.

Accordingly, the thickness of the gate insulating layer disposed between the first semiconductor pattern 351 and the first gate electrode 354 may be greater than the thickness of the gate insulating layer disposed between the second semiconductor pattern 321 and the third semiconductor pattern 331 and between the second gate electrode 324 and the third gate electrode 334. As the thickness of a gate insulating layer increases, leakage of current may be reduced. Accordingly, a thin film transistor including a thick gate insulating layer may be used as a driving thin film transistor for controlling an amount of current. Since a switching thin film transistor performs a switching function for controlling turn-on or turn-off, leakage of current therein may not cause a significant problem. In this regard, the thickness of a gate insulating layer in a thin film transistor performing a switching function may be smaller than the thickness of a gate insulating layer in a thin film transistor used as a driving thin film transistor.

As apparent from the above description, when the gate insulating layer of a thin film transistor is formed to have a large thickness, there may be an advantage in that leakage of current is reduced and, as such, an amount of current may be effectively controlled. However, when the thickness of the gate insulating layer of the thin film transistor increases, characteristics of a switching function may be degraded due to a decrease in mobility. On the other hand, when the gate insulating layer of the thin film transistor has a relatively small thickness, there may an advantage in that characteristics of a switching function may be enhanced due to an increase in mobility. However, as the thickness of the gate insulating layer decreases, current leakage increases, thereby causing characteristics of a current amount control function to be degraded. Therefore, in the display apparatus 40 according to the exemplary embodiment of the present disclosure, the thickness of the gate insulating layer may be designed to be varied in accordance with characteristics of the thin film transistor. Accordingly, the display apparatus 40 may include thin film transistors having different mobilities.

Referring to FIG. 4, the first thin film transistor 350 used as a driving thin film transistor may include a gate insulating layer thicker than the third thin film transistor 330 performing a switching function as a thin film transistor for gate signals. In addition, among the thin film transistors disposed in the display area DA, the first thin film transistor 350 used as a driving thin film transistor configured to supply current to the light emitting element 400 may include a gate insulating layer thicker than the second thin film transistor 320 used as a switching thin film transistor.

Accordingly, the thickness of the gate insulating layer disposed between the first semiconductor pattern 351 and the first gate electrode 354 may be greater than the thickness of the gate insulating layer disposed between the third semiconductor pattern 331 and the third gate electrode 334. In addition, the thickness of the gate insulating layer disposed between the first semiconductor pattern 351 and the first gate electrode 354 may be greater than the thickness of the gate insulating layer disposed between the second semiconductor pattern 321 and the second gate electrode 324. For example, as illustrated in FIG. 4, the gate insulating layer stacked between the first semiconductor pattern 351 and the first gate electrode 354 in the first thin film transistor 350 may be constituted by a stacked structure of the first gate insulating layer 212 and the third gate insulating layer 213 In addition, the gate insulating layer stacked between the third gate electrode 334 and the third semiconductor pattern 331 in the third thin film transistor 330 may be constituted by the first gate insulating layer 212. Furthermore, the gate insulating layer stacked between the second gate electrode 324 and the second semiconductor pattern 321 in the second thin film transistor 320 may also be constituted by the first gate insulating layer 212.

The first gate electrode 354, the second gate electrode 324 and the third gate electrode 334 may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof.

The interlayer insulating layer 214 may be formed on the first gate electrode 354 and the second gate electrode 324.

The interlayer insulating layer 214 may be constituted by a single layer made of silicon nitride ($SiN_x$) or silicon oxide ($SiO_x$) or multiple layers thereof.

Contact holes may be formed to expose the first semiconductor pattern 351 of the first thin film transistor 350, the second semiconductor pattern 321 of the second thin film transistor 320 and the third semiconductor pattern 331 of the third thin film transistor 330 by etching the interlayer insulating layer 214, the second gate insulating layer 213 and the first gate insulating layer 212.

On the interlayer insulating layer 214, the first source electrode 352 and the first drain electrode 353 of the first thin film transistor 350, the second source electrode 322 and the second drain electrode 323 of the second thin film transistor 320, and the third source electrode 332 and the third drain electrode 333 of the third thin film transistor 330 may be disposed.

The first source electrode 352 and the first drain electrode 353 of the first thin film transistor 350 may be connected to the first source region 351S and the first drain region 351D of the first semiconductor pattern 351 via the contact holes formed through the interlayer insulating layer 214, the second gate insulating layer 213, and the first gate insulating layer 212, respectively.

In addition, the second source electrode 322 and the second drain electrode 323 of the second thin film transistor 320 may be connected to the second source region 321S and the second drain region 321D of the second semiconductor pattern 321 via the contact holes formed through the interlayer insulating layer 214, the second gate insulating layer 213 and the first gate insulating layer 212, respectively.

Furthermore, the third source electrode 332 and the third drain electrode 333 of the third thin film transistor 330 may be connected to the third source region 331S and the third drain region 331D of the third semiconductor pattern 331 via the contact holes formed through the interlayer insulating layer 214, the second gate insulating layer 213 and the first gate insulating layer 212, respectively.

The first source electrode 352 and the first drain electrode 353 of the first thin film transistor 350, the second source electrode 322 and the second drain electrode 323 of the second thin film transistor 320, and the third source electrode 332 and the third drain electrode 333 of the third thin film transistor 330 may be disposed to contact an upper surface of the interlayer insulating layer 214, and may be formed by a single layer or multiple layers made of at least one of molybdenum (Mo), copper (Cu), titanium (Ti), aluminum (Al), chromium (Cr), gold (Au), nickel (Ni) or neodymium (Nd) or an alloy thereof.

The passivation layer 215 may be formed on the first source electrode 352 and the first drain electrode 353 of the first thin film transistor 350, the second source electrode 322 and the second drain electrode 323 of the second thin film transistor 320, and the third source electrode 332 and the third drain electrode 333 of the third thin film transistor 330.

A contact hole may be formed through the passivation layer 215 to expose the first drain electrode 353 of the first thin film transistor 350. However, the present disclosure is not limited to the above-described condition. A contact hole may be formed through the passivation layer 215 to expose the first source electrode 352 of the first thin film transistor 350. The passivation layer 215 may be a single layer or multiple layers made of an organic material. For example, the passivation layer 215 may be a single layer or multiple layers made of an organic material such as acryl resin, epoxy resin, phenolic resin, polyamide resin, or polyimide resin. Alternatively, the passivation layer 215 may be constituted by a single layer made of an inorganic material such as silicon nitride ($SiN_x$) or silicon oxide ($SiO_x$) or multiple layers thereof. Otherwise, the passivation layer 215 may be multiple layers constituted by an inorganic material layer and an organic material layer.

The first electrode 410 of the light emitting element 400 may be disposed on the passivation layer 215. The first electrode 410 may be electrically connected to the first thin film transistor 350 via the contact hole formed through the passivation layer 215.

The first electrode 410 may be formed to have a multilayer structure including a transparent conductive film and an opaque conductive film having high reflection efficiency.

The bank layer 216 may be disposed on the first electrode 410 and the passivation layer 215. An opening may be formed through the bank layer 216 to expose the first electrode 410. The bank layer 216 may define a light emission area of the display apparatus and, as such, may be referred to as a "pixel definition film". The spacer 217 may further be disposed on the bank layer 216. In addition, a light emitting layer 420 of the light emitting element 400 may further be disposed on the first electrode 410.

The light emitting layer 420 may be formed on the first electrode 410 in an order of a hole layer HL, an emission material layer EML, and an electron layer EL or a reversed order thereof.

A second electrode 430 of the light emitting element 400 may further be disposed on the light emitting layer 420. The second electrode 430 may overlap with the first electrode 410 under the condition that the light emitting layer 420 is interposed between the second electrode 430 and the first electrode 410.

The encapsulator 500 may be disposed on the second electrode 430 to suppress penetration of moisture.

The display apparatus according to each exemplary embodiment of the present disclosure may be explained as follows.

A display apparatus according to an embodiment of the present disclosure may include a substrate including a display area and a non-display area disposed adjacent to the display area, a first thin film transistor disposed in the display area of the substrate, the first thin film transistor including a first semiconductor pattern including a first polysilicon, a first gate electrode overlapping with the first semiconductor pattern under a condition that a first gate insulating layer is interposed between the first gate electrode and the first semiconductor pattern, a first source electrode connected to the first semiconductor pattern, and a first drain electrode connected to the first semiconductor pattern, a second thin film transistor disposed in the display area of the substrate, the second thin film transistor including a second semiconductor pattern including a first oxide semiconductor, a second gate electrode overlapping with the second semiconductor pattern under a condition that a second gate insulating layer and a third gate insulating layer are interposed between the second gate electrode and the second semiconductor pattern, a second source electrode connected to the second semiconductor pattern, and a second drain electrode connected to the second semiconductor pattern, and a third thin film transistor disposed in the non-display area of the substrate, the third thin film transistor including a third semiconductor pattern including a second oxide semiconductor, a third gate electrode overlapping with the third semiconductor pattern under a condition that the third gate insulating layer is interposed between the third gate electrode and the third semiconductor pattern, and a third source electrode connected to the third semiconductor pattern, and a third drain electrode connected to the third semiconductor pattern.

In accordance with an embodiment of the present disclosure, the display apparatus may further include a fourth thin film transistor disposed in the non-display area of the substrate, the fourth thin film transistor including a fourth semiconductor pattern including a second polysilicon, a fourth gate electrode overlapping with the fourth semiconductor pattern under a condition that the first gate insulating layer is interposed between the fourth gate electrode and the fourth semiconductor pattern, a fourth source electrode connected to the fourth semiconductor pattern, and a fourth drain electrode connected to the fourth semiconductor pattern.

In accordance with an embodiment of the present disclosure, the second gate insulating layer may not be disposed between the third semiconductor pattern and the third gate electrode.

In accordance with an embodiment of the present disclosure, the third semiconductor pattern may be disposed on the second gate insulating layer.

In accordance with an embodiment of the present disclosure, the second thin film transistor may be a driving thin film transistor, and the first thin film transistor may be a switching thin film transistor.

In accordance with an embodiment of the present disclosure, each of the third thin film transistor and the fourth thin film transistor may be a thin film transistor for gate signals performing a switching function.

A display apparatus according to another embodiment of the present disclosure may include a substrate including a display area and a non-display area disposed adjacent to the display area, a first thin film transistor disposed in the display area of the substrate, the first thin film transistor including a first semiconductor pattern including a first oxide semiconductor, a first gate electrode overlapping with the first semiconductor pattern under a condition that a second gate insulating layer and a third gate insulating layer are interposed between the first gate electrode and the first semiconductor pattern, a first source electrode connected to the first semiconductor pattern, and a first drain electrode connected to the first semiconductor pattern, a second thin film transistor disposed in the display area of the substrate, the second thin film transistor including a second semiconductor pattern including a second oxide semiconductor, a second gate electrode overlapping with the second semiconductor pattern under a condition that the third gate insulating layer is interposed between the second gate electrode and the second semiconductor pattern, a second source electrode connected to the second semiconductor pattern, and a second drain electrode connected to the second semiconductor pattern, and a third thin film transistor disposed in the non-display area of the substrate, the third thin film transistor including a third semiconductor pattern including a polysilicon, a third gate electrode overlapping with the third semiconductor pattern under a condition that a first gate insulating layer is interposed between the third gate electrode and the third semiconductor pattern, and a third source electrode connected to the third semiconductor pattern, and a third drain electrode connected to the third semiconductor pattern. In accordance with an embodiment of the present disclosure, the first gate insulating layer, the second gate insulating layer, and the third gate insulating layer may be disposed on different layers, respectively.

In accordance with an embodiment of the present disclosure, the second gate insulating layer may be disposed on the first gate insulating layer, and the third gate insulating layer may be disposed on the second gate insulating layer.

In accordance with an embodiment of the present disclosure, the second gate insulating layer may not be disposed between the second semiconductor pattern and the second gate electrode.

In accordance with an embodiment of the present disclosure, the first thin film transistor may be a driving thin film transistor, the second thin film transistor may be a switching thin film transistor, and the third thin film transistor may be a thin film transistor for gate signals performing a switching function.

In accordance with an embodiment of the present disclosure, it may be possible to form a conductive portion of a semiconductor layer through a doping process using a photoresist pattern as a mask, without patterning of a gate insulating film.

In accordance with another embodiment of the present disclosure, it may be possible to provide a display apparatus including thin film transistors having different mobility characteristics by differently designing stacked structures of gate insulating layers of thin film transistors respectively disposed in a display area and a non-display area in the display apparatus. In addition, it may be possible to realize an image of high quality in the display apparatus by virtue of provision of the thin film transistors having different mobility characteristics. In accordance with another embodiment of the present disclosure, gate insulating films of a driving thin film transistor to control current flowing through a light emitting element disposed in the display area and a switching thin film transistor to control ON/OFF of the driving thin film transistor may be formed to have different stacked structures. Accordingly, it may be possible to provide thin film transistors respectively suitable for different thin film transistor characteristics and, as such, the resultant display apparatus may have enhanced functions.

Although the foregoing description has been given mainly in conjunction with embodiments, these embodiments are only illustrative without limiting the invention. Those skilled in the art to which the present invention pertains can appreciate that various modifications and applications illustrated in the foregoing description may be possible without changing essential characteristics of the embodiments. Therefore, the above-described embodiments should be understood as exemplary rather than limiting in all aspects. In addition, the scope of the present invention should also be interpreted by the claims below rather than the above detailed description. All modifications or alterations as would be derived from the equivalent concept intended to be included within the scope of the present invention should also be interpreted as falling within the scope of the invention.

What is claimed is:

1. A display apparatus comprising:
   a substrate comprising a display area and a non-display area that is adjacent to the display area;
   a second thin film transistor in the display area of the substrate, the second thin film transistor comprising a second semiconductor pattern comprising a second oxide semiconductor, a second gate electrode overlapping the second semiconductor pattern such that a second gate insulating layer is interposed between the second gate electrode and the second semiconductor pattern, a second source electrode connected to the second semiconductor pattern, and a second drain electrode connected to the second semiconductor pattern;
   a first conductive pattern between the display area of the substrate and the second semiconductor pattern of the second thin film transistor; and
   a second buffer layer including a silicon nitride layer interposed between the second semiconductor pattern and the first conductive pattern,
   wherein the first conductive pattern is connected to any of the second source electrode and the second drain electrode.

2. The display apparatus according to claim 1, further comprising:
   a first thin film transistor in the display area of the substrate, the first thin film transistor comprising a first semiconductor pattern comprising a first polysilicon on a first buffer layer, a first gate electrode overlapping the first semiconductor pattern such that a first gate insulating layer is interposed between the first gate electrode and the first semiconductor pattern, a first source electrode connected to the first semiconductor pattern, and a first drain electrode connected to the first semiconductor pattern.

3. The display apparatus according to claim 2, wherein the second thin film transistor is a driving thin film transistor and the first thin film transistor is a switching thin film transistor.

4. The display apparatus according to claim 2, further comprising:
   a fourth thin film transistor disposed in the non-display area of the substrate, the fourth thin film transistor comprising a fourth semiconductor pattern comprising a second polysilicon on the first buffer layer, a fourth gate electrode overlapping the fourth semiconductor pattern such that the first gate insulating layer is interposed between the fourth gate electrode and the fourth semiconductor pattern, a fourth source electrode connected to the fourth semiconductor pattern, and a fourth drain electrode connected to the fourth semiconductor pattern.

5. The display apparatus according to claim 4, wherein the first conductive pattern is connected to any one of the second source electrode and the second drain electrode by a first connecting electrode, and the second conductive pattern is connected to any one of the fourth source electrode and the fourth drain electrode by a second connecting electrode.

6. The display apparatus according to claim 1, further comprising:
a third thin film transistor disposed in the non-display area of the substrate, the third thin film transistor comprising a third semiconductor pattern comprising a second oxide semiconductor, a third gate electrode overlapping the third semiconductor pattern, a third source electrode connected to the third semiconductor pattern, and a third drain electrode connected to the third semiconductor pattern; and
a second conductive pattern between the non-display area of the substrate and the third semiconductor pattern of the third thin film transistor,
wherein the second buffer layer extends to the non-display area and is interposed between the third semiconductor pattern and the second conductive pattern.

7. The display apparatus according to claim 6, wherein the second conductive pattern is connected to any of the third source electrode and the third drain electrode.

8. The display apparatus according to claim 6, wherein a first thickness of an insulating layer between the second semiconductor pattern and the first conductive pattern is less than a second thickness of an insulating layer between the third semiconductor pattern and the second conductive pattern.

9. The display apparatus according to claim 6, wherein the first thin film transistor is a driving thin film transistor and the third thin film transistor is a thin film transistor that performs a switching function of gate signals.

10. The display apparatus according to claim 6, a third thickness of an insulating layer between the second semiconductor pattern and the second gate electrode is greater than a fourth thickness of an insulating layer between the third semiconductor pattern and the third gate electrode.

11. The display apparatus according to claim 6, wherein the second semiconductor pattern and the third semiconductor pattern are disposed on a different layer each other.

12. A display apparatus comprising:
a substrate comprising a display area and a non-display area that is adjacent to the display area;
a first thin film transistor in the display area, the first thin film transistor comprising a first semiconductor pattern comprising a first oxide semiconductor, a first gate electrode overlapping the first semiconductor pattern, a first source electrode connected to the first semiconductor pattern, and a first drain electrode connected to the first semiconductor pattern;
a second thin film transistor in the display area, the second thin film transistor comprising a second semiconductor pattern comprising a second oxide semiconductor, a second gate electrode overlapping the second semiconductor pattern, a second source electrode connected to the second semiconductor pattern, and a second drain electrode connected to the second semiconductor pattern;
a third thin film transistor in the non-display area, the third thin film transistor comprising a third semiconductor pattern comprising a third oxide semiconductor, a third gate electrode overlapping the third semiconductor pattern, a third source electrode connected to the third semiconductor pattern, and a third drain electrode connected to the third semiconductor pattern;
a first conductive pattern under the first semiconductor pattern and overlapping with the first semiconductor pattern;
a second conductive pattern under the second semiconductor pattern and overlapping with the second semiconductor pattern; and
a third conductive pattern under the third semiconductor pattern and overlapping with the third semiconductor pattern;
wherein a first thickness of an insulating layer between the first semiconductor pattern and the first conductive pattern is less than a second thickness of an insulating layer between the second semiconductor pattern and the second conductive pattern.

13. The display apparatus according to claim 12, wherein the first semiconductor pattern and the second semiconductor pattern are on a different layer from each other.

14. The display apparatus according to claim 12, wherein the first conductive pattern, the second conductive pattern, and the third conductive pattern are a single layer or multilayers including titanium.

15. The display apparatus according to claim 12, further comprising:
a buffer layer covering the first conductive pattern, the second conductive pattern, and the third conductive pattern.

16. The display apparatus according to claim 15, wherein the buffer layer is multilayer including a silicon nitride layer.

17. The display apparatus according to claim 15, wherein the first conductive pattern, the second conductive pattern, and the third conductive pattern are on a same layer.

18. The display apparatus according to claim 17, wherein the first thin film transistor is driving thin film transistor, the second thin film transistor is switching thin film transistor, and the third thin film transistor is configured to perform a switching function of gate signals.

19. A display apparatus comprising:
a substrate comprising a display area and a non-display area that is adjacent to the display area;
a first thin film transistor in the display area of the substrate, the first thin film transistor comprising a first semiconductor pattern comprising a first oxide semiconductor, a first gate electrode overlapping the first semiconductor pattern such that a second gate insulating layer is interposed between the first gate electrode and the first semiconductor pattern, a first source electrode connected to the first semiconductor pattern, and a first drain electrode connected to the first semiconductor pattern;
a second thin film transistor in the display area of the substrate, the second thin film transistor comprising a second semiconductor pattern comprising a second oxide semiconductor, a second gate electrode overlapping the second semiconductor pattern, a second source electrode connected to the second semiconductor pattern, and a second drain electrode connected to the second semiconductor pattern;
a third thin film transistor in the non-display area of the substrate, the third thin film transistor comprising a third semiconductor pattern comprising a first polysilicon on a first buffer layer, a third gate electrode overlapping the third semiconductor pattern such that a first gate insulating layer is interposed between the third gate electrode and the third semiconductor pattern, a third source electrode connected to the third semiconductor pattern, and a third drain electrode connected to the third semiconductor pattern;
a first conductive pattern between the display area of the substrate and the first semiconductor pattern of the first thin film transistor;
a second conductive pattern between the display area of the substrate and the second semiconductor pattern of the second thin film transistor; and
a second buffer layer including a silicon nitride layer interposed between the first semiconductor pattern and the first conductive pattern,
wherein a first thickness of an insulating layer between the first semiconductor pattern and the first conductive pattern is less than a second thickness of an insulating layer between the second semiconductor pattern and the second conductive pattern.

* * * * *